United States Patent
Matsui et al.

(10) Patent No.: US 8,310,645 B2
(45) Date of Patent: Nov. 13, 2012

(54) WIRING BOARD AND LIQUID CRYSTAL DISPLAY DEVICE

(75) Inventors: Takashi Matsui, Osaka (JP); Motoji Shiota, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 41 days.

(21) Appl. No.: 12/995,578

(22) PCT Filed: Apr. 10, 2009

(86) PCT No.: PCT/JP2009/057356
§ 371 (c)(1), (2), (4) Date: Dec. 1, 2010

(87) PCT Pub. No.: WO2009/157247
PCT Pub. Date: Dec. 30, 2009

(65) Prior Publication Data
US 2011/0075088 A1    Mar. 31, 2011

(30) Foreign Application Priority Data
Jun. 25, 2008   (JP) .................................. 2008-166015

(51) Int. Cl.
*G02F 1/1343* (2006.01)
*G02F 1/1345* (2006.01)

(52) U.S. Cl. ........ 349/149; 349/141; 349/142; 349/143; 349/158; 257/734

(58) Field of Classification Search .......... 349/141–143, 349/149, 158; 257/734
See application file for complete search history.

(56) References Cited

U.S. PATENT DOCUMENTS

| 6,525,422 | B1 * | 2/2003 | Ono et al. ..................... 257/737 |
| 6,933,607 | B2 * | 8/2005 | Ono et al. ..................... 257/737 |
| 7,005,741 | B2 * | 2/2006 | Ono et al. ..................... 257/737 |
| 2002/0071086 | A1 | 6/2002 | Kim |

(Continued)

FOREIGN PATENT DOCUMENTS

JP        05-029377        2/1993

(Continued)

OTHER PUBLICATIONS

International Search Report for PCT/JP2009/057356, mailed Jul. 7, 2009.

(Continued)

*Primary Examiner* — Brian M. Healy
*Assistant Examiner* — Mary El Shammaa
(74) *Attorney, Agent, or Firm* — Nixon & Vanderhye, P.C.

(57) ABSTRACT

A wiring board of the present invention has pads disposed in a plurality of rows including: first row pads each being connected to a respective one of the connection wires that is long in length; and second row pads (30b) each being connected to a respective one of the connection wires that is shorter in length than that of first connection wires (10a) connected to the first row pads, each of the first connection wires (10a) being provided not in a region between adjacent ones of the second row pads (30b) but in a lower layer region of the second row pads (30b), in such a manner that at least a first insulating layer (20a) is sandwiched between the second row pads (30b) and the first connection wires (10a), and $0.8 \leq W1/W2 \leq 1$, where W1 is a line width of the first connection wires (10a) in the lower layer region of the second row pads (30b), and W2 is a width of the second row pads (30b).

14 Claims, 22 Drawing Sheets

U.S. PATENT DOCUMENTS

| | | |
|---|---|---|
| 2002/0180900 A1 | 12/2002 | Chae et al. |
| 2003/0067072 A1* | 4/2003 | Ono et al. ............... 257/737 |
| 2004/0027508 A1 | 2/2004 | Akiyama et al. |
| 2004/0085504 A1 | 5/2004 | Kim |
| 2004/0165138 A1 | 8/2004 | Hwang |
| 2005/0194678 A1 | 9/2005 | Chuang |
| 2006/0231846 A1 | 10/2006 | Hong et al. |
| 2007/0188693 A1 | 8/2007 | Hwang |
| 2011/0075088 A1* | 3/2011 | Matsui et al. ............ 349/149 |

FOREIGN PATENT DOCUMENTS

| | | |
|---|---|---|
| JP | 11-282012 | 10/1999 |
| JP | 11-307902 | 11/1999 |
| JP | 2002-202522 | 7/2002 |
| JP | 2004-252466 | 9/2004 |
| JP | 2005-252226 | 9/2005 |
| JP | 2005-294615 | 10/2005 |

OTHER PUBLICATIONS

U.S. Appl. No. 12/673,307, Matsui, filed Feb. 12, 2010.
U.S. Appl. No. 12/673,440, Matsui, filed Feb. 12, 2010.
U.S. Office Action mailed Jan. 6, 2012 in U.S. Appl. No. 12/673,307.
Office Action mailed Jun. 27, 2012 in U.S. Appl. No. 12/995,578.
Office Action mailed Jul. 27, 2012 in U.S. Appl. No. 12/673,440.
Office Action mailed May 17, 2012 in U.S. Appl. No. 12/673,307.
Notice of Allowance mailed Sep. 4, 2012 in U.S. Appl. No. 12/673,307.

* cited by examiner

F I G. 1 2
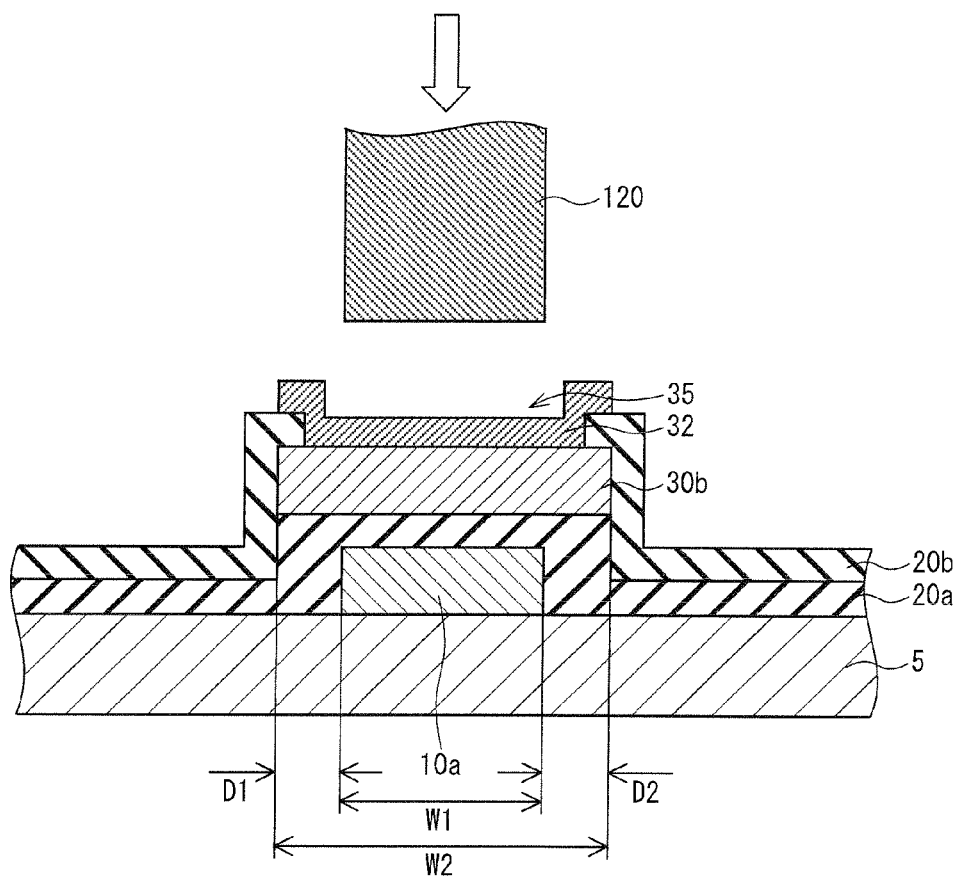

F I G. 1 4
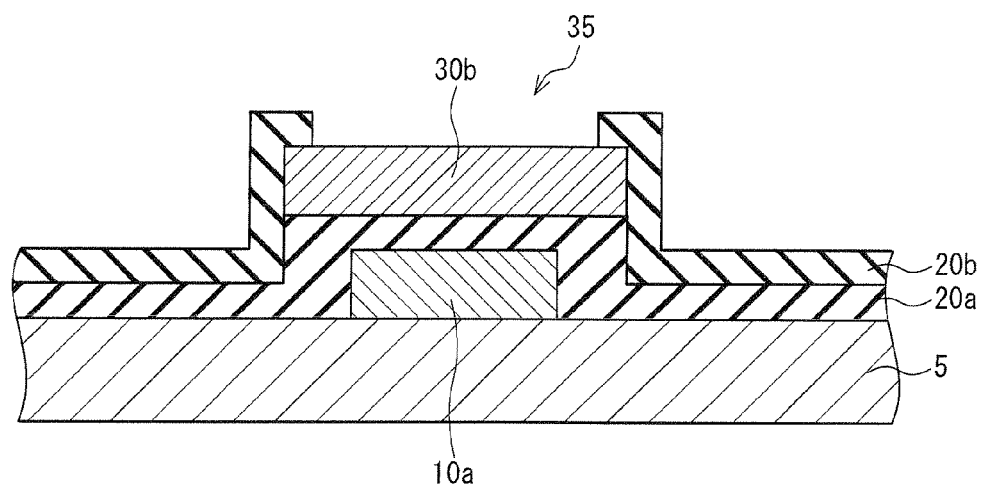

F I G. 2 1
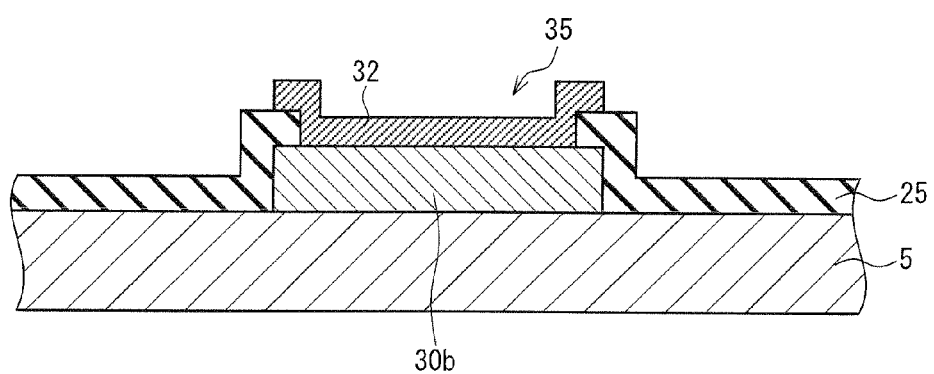
F I G. 2 2
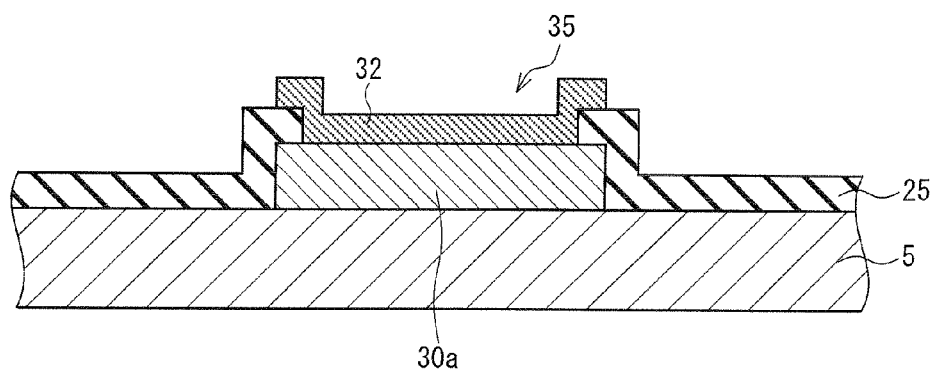

WIRING BOARD AND LIQUID CRYSTAL DISPLAY DEVICE

This application is the U.S. national phase of International Application No. PCT/JP2009/057356, filed 10 Apr. 2009, which designated the U.S. and claims priority to Japanese Patent Application No. 2008-166015, filed 25 Jun. 2008, the entire contents of each of which are hereby incorporated by reference.

TECHNICAL FIELD

The present invention relates to a wiring board, particularly a wiring board on which a plurality of rows of pads are provided, and to a liquid crystal display device including the wiring board.

BACKGROUND ART

Conventionally, in order to carry out mounting with a narrow pitch, wiring boards are widely used, which wiring boards have pads disposed thereon in so-called plurality of rows.

Along with the demand for further reduction of size and weight of electronic apparatuses that use the wiring board, electronic components mounted in such electronic apparatuses are becoming more compact. This demand has also caused a demand for achieving a further narrow pitch in a wiring board which is a substrate on which the electronic components are mounted.

(Patent Literature 1)

Various techniques have been proposed to meet such demands. For example, Patent Literature 1 discloses a technique of a wiring board which mounts pads that are disposed in a plurality of rows. The wiring board provides the pads in a layer different from metal wires that pass between the pads disposed adjacent to each other, and further the pads are provided to have a double-layered structure. The following description explains this technique with reference to FIGS. 23 and 24. FIG. 23 is a view illustrating a configuration of a wiring board disclosed in Patent Literature 1, and FIG. 24 is a cross-sectional view taken along line X-X in FIG. 23. The "first row" and "second row" in FIG. 23 are names provided to respective rows in which pads 105 are disposed.

As illustrated in FIG. 23, a wiring board 100 disclosed in Patent Literature 1 has metal wires 101 disposed between adjacent pads 105 in the second row among the pads 105 disposed in the plurality of rows. Each of the metal wires 101 is connected to a respective one of the pads 105 in the first row. The metal wires 101 are provided in a layer different from the pads 105 in the second row, as illustrated in FIG. 24. Namely, the pads 105 are provided in an upper layer of the metal wires 101 as a layer different from the metal wire 101, in such a manner that an interlayer insulating layer 102 is provided between the pads 105 and the metal wires 101.

Moreover, each of the pads 105 in the first row and the second row are connected to a respective one of the metal wires 101 provided in the layer different from that of the pads 105, via a through-hole 103 (see FIG. 23). Furthermore, a pad 109 having an area larger than that of the pad 105 is provided in an upper layer of each of the pads 105, via an interlayer insulating layer 106. The pads 105 and pads 109 are connected via a pad through-hole 107 (see FIG. 23). That is to say, the metal wires 101, the pads 105, and the pads 109 are provided in different layers; i.e., the metal wires 101 are provided in a first layer, the pads 105 are provided in a second layer, and the pads 109 are provided in a third layer.

As described above, the wiring board 100 disclosed in Patent Literature 1 has the metal wires 101 that are disposed between the pads 105 in the second row be provided in a different layer from the pads 105 and pads 109 (the interlayer insulating layer 102 is provided in an upper layer of the metal wires 101). This makes it possible to reduce spaces between adjacent pads 109 to a certain degree.

(Patent Literature 2)

The following description explains an example of a case where the wiring board, which wiring board is a substrate on which an electronic component is mounted, is used as a substrate for use in a display device, with reference to Patent Literature 2.

Patent Literature 2 discloses a configuration in which pads disposed in the plurality of rows are formed on a liquid crystal panel. The following description is provided with reference to FIGS. 25 to 27. FIG. 25 is a view illustrating a configuration of a liquid crystal panel disclosed in Patent Literature 2, FIG. 26 is a view illustrating a configuration of a bottom side of a driving IC (Integrated Circuit) illustrated in FIG. 25, and FIG. 27 is a view illustrating a liquid crystal panel on which the driving IC illustrated in FIG. 26 is mounted.

As illustrated in FIG. 25, the liquid crystal panel 300 disclosed in Patent Literature 2 has a driving IC 400 directly mounted on the liquid crystal panel 300 (COG (Chip On Glass) mounting). On a bottom side of the driving IC 400 that is COG mounted on the liquid crystal panel 300, bumps 410 are disposed in a plurality of rows, as illustrated in FIG. 26. Further, in a region of the liquid crystal panel 300 on which the driving IC 400 is mounted, electrode pads 320 that correspond to the bumps 410 disposed on the bottom side of the driving IC 400 are provided, as illustrated in FIG. 27. The electrode pads 320 are connected to input lines 310, respectively, which input lines 310 are wires connecting to the pads.

CITATION LIST

Patent Literature

Patent Literature 1

Japanese Patent Application Publication, Tokukaihei, No. 5-29377 A (Publication Date: Feb. 5, 1993)

Patent Literature 2

Japanese Patent Application Publication, Tokukai, No. 2004-252466 A (Publication Date: Sep. 9, 2004)

SUMMARY OF INVENTION

Technical Problem (Bad Leakage)

However, with the configuration disclosed in Patent Literature 1, malfunction caused by an electric leakage (hereinafter referred to a bad leakage) easily occurs between the pads 109 and the metal wires 101, at a time when an electronic component such as a driving IC is mounted. This point is described below with reference to FIG. 28. FIG. 28 is a view schematically illustrating how an electronic component is mounted on a wiring board.

As illustrated in FIG. 28, when a bump 120 provided on a driving IC is mounted on the wiring board 100 in such a manner that an anisotropic conductive film (ACF: Anisotropic Conductive Film) 130 is sandwiched between the bump 120 and the wiring board 100, a pressing pressure (arrow in FIG. 28) is applied to the wiring board 100. Effected by the pressing pressure also being applied to the pad 109 and the metal wire 101, the pad 109 and the metal wire 101 come into contact with each other, which may cause a bad leakage as a result. The contact of the pad 109 with the metal wire 101 easily occurs in a region having a narrowest space provided between the pad 109 and the metal wire 101 (short region RS1 in FIG. 28).

Moreover, as illustrated in FIG. 28, the bad leakage more easily occurs particularly in a case where the driving IC shifts in position upon mounting the bump 120, thereby causing misalignment between the bump 120 and the pad 109.

As described above, one case where the bad leakage occurs is a case where a pad is made into contact with a corner section of a connection wire provided between respective two adjacent pads.

(Narrow Pitch)

In order to prevent the occurrence of the bad leakage of the previous case, it may be considered to provide the pad a long distance away from the connection wire. More specifically, for example with the wiring board illustrated in FIG. 28, one possible configuration is to broaden the spaces between the pads 109 and the metal wires 101 in a plan direction (broaden the space between the pad 109 and the metal wire 101 in the short region RS1 in FIG. 28, in a plan direction).

Such a configuration provides the pads 109 and the metal wires 101 separated away, so therefore it is possible to prevent the occurrence of the bad leakage in the region RS1.

However, providing the metal wires 101 between adjacent pads 109 and further broadening the spaces between the metal wires 101 and the pads 109 cause intervals of the adjacent pads 109 to be broadly spaced out as a result.

Consequently, although this configuration allows preventing occurrence of the bad leakage of the previous case, this obstructs attaining of a narrow pitch of the pads 109.

The present invention is accomplished in view of the foregoing problem, and its object is to achieve a wiring board and a liquid crystal display device, each in which bad leakage is difficult to occur while allowing attainment of a narrow pad pitch.

Solution to Problem

In order to attain the object, a wiring board of the present invention is a wiring board including: a substrate; pads; and connection wires connected to the pads, respectively, the pads being disposed in a plurality of rows, the pads disposed in the plurality of rows including: first row pads each being connected to a respective one of the connection wires that is long in length; and second row pads each being connected to a respective one of the connection wires that is shorter in length than that of the connection wires connected to the first row pads, each of the connection wires connected to the first row pads being provided not in a region between respective adjacent ones of the second row pads but in a lower layer region of the second row pads, in such a manner that at least an insulating layer is sandwiched between the second row pads and the connection wires connected to the first row pads, and $0.8 \leq W1/W2 \leq 1$, where W1 is a line width of the connection wires connected to the first row pads in the lower layer region of the second row pads, and W2 is a width of the second row pads.

In order to attain the object, a wiring board of the present invention is a wiring board including: a substrate; pads; and connection wires connected to the pads, respectively, the pads being disposed in a plurality of rows, the pads disposed in the plurality of rows including first row pads and second row pads, each of the first row pads being provided with a respective one of the connection wires connected to the first row pad, the connection wire connected to the first row pad passing through not a region between adjacent ones of the second row pads but a lower layer region of the second row pads, the second row pads and the connection wires connected to the first row pads sandwiching at least an insulating layer therebetween, and $0.8 \leq W1/W2 \leq 1$, where W1 is a line width of the connection wires connected to the first row pads in the lower layer region of the second row pads, and W2 is a width of the second row pads.

According to the configuration, pads that are disposed in a plurality of rows are disposed in such a manner that each of first row pads is connected to a connection wire without having the connection wire that extends to the first row pad be provided between adjacent second row pads.

Described below is an example of a case where the wiring board is a glass substrate for use in a liquid crystal display device, on which metal wires and like members are formed. Namely, for example, in a case where a TFT (Thin Film Transistor) provided in a central part of a glass substrate for use in a liquid crystal display device is required to be connected to a driving IC or the like, and bumps of the IC are disposed in a plurality of rows, the first row pads from among the pads on which the driving IC is to be mounted are connected to respective draw-out wires from the TFT, without having a connection wire be provided between a second row pad and another second row pad adjacent to the second row pad.

As a result, with the wiring board of the present invention, it is possible to prevent the occurrence of bad leakage that occurs caused by the pad being in contact with the connection wire.

Namely, in a case where a connection wire is formed between adjacent pads, and space between the pads and the connection wire is made narrow to attain a narrow pitch of the pads, the pad easily is made into contact with the connection wire in the narrow space. This contact easily occurs at a time when electronic components are mounted on the pads, particularly in a case where the electronic component moves in position at the time of mounting, caused by application of a pressing force to the substrate.

On the other hand, in the wiring board of the present invention, no connection wire is provided between adjacent pads. This makes it difficult for bad leakage to occur, which bad leakage is caused by the contact between the pads and the connection wire.

Moreover, with the configuration, it is also possible to prevent occurrence of bad leakage caused by the pads and the connection wire made into contact with each other in a case where the pads are formed superposing the connection wire when seen as a plan view. This is described below.

Namely, when an electronic component or like member is mounted on the pad, pressing force is applied to the pad from a connection terminal such as a bump of the electronic component. This pressing force acts to cause contact of the pad with a connection wire provided in a lower layer region of the pad, which connection wire is provided having an insulating layer sandwiched between the connection wire and the pad. In a case where the pressing force is great, the pad and the connection wire in the lower layer at times are made to be in contact with each other, thereby causing bad leakage.

Here, the inventor found out that the contact of the pad with the connection wire easily occurs in a case where the width of the pad is sufficiently broader with respect to the line width of the connection wire in the lower layer of the pad.

This is because in the case where the width of the pad is sufficiently wider than that of the connection wire, the pad is more easily deformable due to the pressing force received from the connection terminal. This deformation of the pad causes the pad to easily be in contact with the connection wire.

More specifically, the force causes the pad to bend in a grooved shape in such a manner that the connection wire in the lower layer is covered by the pad. As a result, this bent pad is more easily made to be in contact with corner sections of both edges of the connection wire, thereby causing easier occurrence of the bad leakage.

In comparison, the foregoing configuration satisfies an inequation of $0.8 \leq W1/W2 \leq 1$, where W1 is a line width of the connection wire in the lower layer region of the second row pad and W2 is a width of the second row pad.

Namely, the line width of the connection wire is the same width as the width of the pad, or alternatively, the line width of the connection wire has a width of at least 80% or more of the pad.

Further, as described above, the line width of the connection wire is sufficiently broad with respect to the width of the pad; in other words, the width of the pad is insufficiently broader than the line width of the connection wire. Hence, deformation of the pad caused by the force is difficult to occur.

As a result, it is possible to prevent the occurrence of the bad leakage caused by the pad being in contact with the connection wire provided in the lower layer of the pad.

(Narrow Pitch)

Moreover, the wiring board of the present invention can achieve a narrow pitch of the pads.

Namely, in the configuration, the connection wire is provided in a lower layer region of the pad. Hence, there is no need to provide the connection wire between a second row pad and another second row pad. Consequently, even if the space between a second row pad and an adjacent second row pad is made narrow, it is still difficult for the second row pad to be made into contact with the connection wire. This as a result allows attaining a narrow pitch.

As described above, with the aforementioned wiring board configuration, it is possible to achieve a wiring board in which bad leakage is difficult to occur, while allowing the attainment of a narrow pad pitch.

Moreover, the wiring board of the present invention can be configured in such a manner that $0 \, \mathrm{um} \leq D \leq 1 \, \mathrm{um}$, where D is a distance from an edge, in the line width direction, of the connection wires connected to the first row pads in the lower layer region of the second row pads, to an edge of a respective one of the second row pads corresponding to the edge of the connection wires connected to the first row pads, when seen as a plan view.

According to the configuration, a width of a pad edge that extends out from the connection wire provided in the lower layer region of the pad, when seen as a plan view, is made to be within 1 um.

Therefore, it is possible to reduce the bending of the pad caused by the pressing force applied at the time of the mounting.

This makes it possible to further prevent the occurrence of bad leakage between the pad and the connection wire provided in the lower layer of the pad.

Moreover, the wiring board of the present invention is preferably configured in such a manner that the line width W1 of the connection wire and the width W2 of the second row pad are of a same width.

Moreover, the wiring board of the present invention is preferably configured in such a manner that both edges, in the line width direction, of the connection wires in the lower layer region of the second row pads are in line with both edges, in the width direction, of the respective one of the second row pads, when seen as a plan view.

According to the configuration, the pad has a same width as that of the connection wire provided in a lower layer region of the pad, and both edge sides of the pad and the connection wire each in the width direction are in line with each other, when seen from a plan view.

Therefore, it is possible to further reduce the bending of the pad caused by the pressing force applied at the time of the mounting.

Hence, it is possible to more securely prevent the occurrence of the bad leakage between the pad and the connection wire provided in the lower layer of the pad.

Moreover, the wiring board of the present invention may be configured in such a manner that each of the second row pads is formed by broadening the line width of the connection wire connected to the second row pad.

According to the configuration, the second row pad is formed by broadening the line width of the connection wire. Hence, it is possible to form the second row pad in a region in which the second row pad superposes the connection wire connected to the first row pad, in a simple method.

Moreover, the wiring board of the present invention is preferably configured in such a manner that the second row pads are softer than the connection wires connected to the first row pads.

Moreover, the wiring board of the present invention maybe configured in such a manner that the second row pads are made of aluminum, and the connection wires connected to the first row pads are made of any one of titanium, titanium nitride, an alloy of titanium and titanium nitride, tantalum, tantalum nitride, and an alloy of tantalum and tantalum nitride.

Moreover, the wiring board of the present invention maybe configured in such a manner that the second row pads are made of aluminum or titanium, and the connection wires connected to the first row pads are made of nickel.

According to the configuration, the pad provided in the upper layer is softer than the connection wire provided in the lower layer, in the region in which the pad superposes the connection wire. Hence, it is possible to further prevent the occurrence of bad leakage caused by the pad being in contact with the connection wire.

That is to say, the contact between the superposed pad and connection wire occurs due to the effect of a force that presses the connection wire from the superposed pad in a direction of the substrate (direction perpendicular to the substrate and direction towards the substrate from the pad), at a time when for example an electronic component such as a driving IC is mounted to the pad.

Meanwhile, according to the configuration, the pad provided in the upper layer is softer than the connection wire provided in the lower layer, thereby allowing relaxation (stress relaxation) of the force by the pad in the upper layer. As a result, it is difficult to cause the superposed pad and connection wire to be made into contact with each other.

Therefore, it is possible to prevent occurrence of the bad leakage caused by the superposed pad being in contact with the connection wire.

Moreover, the wiring board of the present invention may be configured in such a manner that the substrate is a substrate for use in a display device.

Moreover, the wiring board of the present invention maybe configured in such a manner that the substrate for use in a display device is a glass substrate for use in a liquid crystal display device.

According to the configuration, the wiring board having the aforementioned pads and connection wires may be used as a substrate for use in a display device for example an EL (Electro Luminescence) display device or a liquid crystal display device.

This allows reduction in size of a connection region of a substrate for use in a display device, thereby allowing achievement of size reduction of a substrate for use in a display device, such as reducing a size of a frame of the substrate for use in the display device.

Moreover, the wiring board of the present invention may be configured in such a manner that the substrate is a substrate for use in printed wiring.

According to the configuration, the aforementioned wiring board is used as a substrate for use in printed wiring. Hence, it is possible to achieve reduction in size of a printed-wiring board.

In order to attain the object, a liquid crystal display device of the present invention includes: a wiring board including a substrate, pads, and connection wires connected to the pads, respectively, the pads being disposed in a plurality of rows; and an electronic component mounted on the pads of the wiring board, the wiring board being a glass substrate for use in a liquid crystal display device, the pads disposed in the plurality of rows including: first row pads each being connected to a respective one of the connection wires that is long in length; and second row pads each being connected to a respective one of the connection wires that is shorter in length than that of the connection wires connected to the first row pads, each of the connection wires connected to the first row pads being provided not in a region between respective adjacent ones of the second row pads but in a lower layer region of the second row pads, in such a manner that at least an insulating layer is sandwiched between the second row pads and the connection wires connected to the first row pads, and $0.8 \leq W1/W2 \leq 1$, where W1 is a line width of the connection wires connected to the first row pads in the lower layer region of the second row pads, and W2 is a width of the second row pads.

In order to attain the object, a liquid crystal display device of the present invention includes: a wiring board including a substrate, pads, and connection wires connected to the pads, respectively, the pads being disposed in a plurality of rows; and an electronic component mounted on the pads of the wiring board, the wiring board being a glass substrate for use in a liquid crystal display device, the pads disposed in the plurality of rows including first row pads and second row pads, each of the first row pads being provided with a respective one of the connection wires connected to the first row pad, the connection wire connected to the first row pad passing through not a region between adjacent ones of the second row pads but a lower layer region of the second row pads, the second row pads and the connection wires connected to the first row pads sandwiching at least an insulating layer therebetween, and $0.8 \leq W1/W2 \leq 1$, where W1 is a line width of the connection wires connected to the first row pads in the lower layer region of the second row pads, and W2 is a width of the second row pads.

With the configuration, it is possible to narrow a pitch of pads provided on a glass substrate for use in a liquid crystal display device. Therefore, with a liquid crystal display device or the like in which an electronic component is directly mounted (COG (Chip On Glass) mounting) on a glass substrate for use in a liquid crystal display device, it is possible to narrow the frame or reduce thickness of the liquid crystal display device or the like.

Moreover, bad leakage does not easily occur at a time when the electronic component or the like is mounted, so it is possible to manufacture the liquid crystal display device in a higher yield. Further, it is possible to improve reliability of the manufactured liquid crystal display device.

ADVANTAGEOUS EFFECTS OF INVENTION

As described above, a wiring board and a liquid crystal display device of the present invention has pads disposed in a plurality of rows including: first row pads each being connected to a respective one of the connection wires that is long in length; and second row pads each being connected to a respective one of the connection wires that is shorter in length than that of the connection wire connected to the first row pad, each of the connection wires connected to the first row pads being provided not in a region between respective adjacent ones of the second row pads but in a lower layer region of the second row pads, in such a manner that at least an insulating layer is sandwiched between the second row pads and the connection wires connected to the first row pads, and $0.8 \leq W1/W2 \leq 1$, where W1 is a line width of the connection wires connected to the first row pads in the lower layer region of the second row pads, and W2 is a width of the second row pads.

Moreover, as described above, a wiring board and a liquid crystal display device of the present invention has pads disposed in a plurality of rows including first row pads and second row pads, each of the first row pads being provided with a respective one of the connection wires connected to the first row pad, the connection wire connected to the first row pad passing through not a region between adjacent ones of the second row pads but a lower layer region of the second row pads, the second row pads and the connection wires connected to the first row pads sandwiching at least an insulating layer therebetween, and $0.8 \leq W1/W2 \leq 1$, where W1 is a line width of the connection wires connected to the first row pads in the lower layer region of the second row pads, and W2 is a width of the second row pads.

Hence, an effect is attained that it is possible to achieve a wiring board and a liquid crystal display device, each in which bad leakage is difficult to occur while allowing attainment of a narrow pad pitch.

BRIEF DESCRIPTION OF DRAWINGS

FIG. 12 is a view schematically illustrating a cross section taken along line G-G of FIG. 11.

FIG. 14 is a view illustrating a cross section taken along line G-G of FIG. 11, of another configuration.

FIG. 21 is a view schematically illustrating a cross section taken along line N-N of FIG. 18.

FIG. 22 is a view schematically illustrating a cross section taken along line 0-0 of FIG. 18.

DESCRIPTION OF EMBODIMENTS

One embodiment of the present invention is described below, with reference to drawings. To more clarify the features of the present invention, explanation is provided below based on a comparison with a conventional wiring board.

Figure 1:
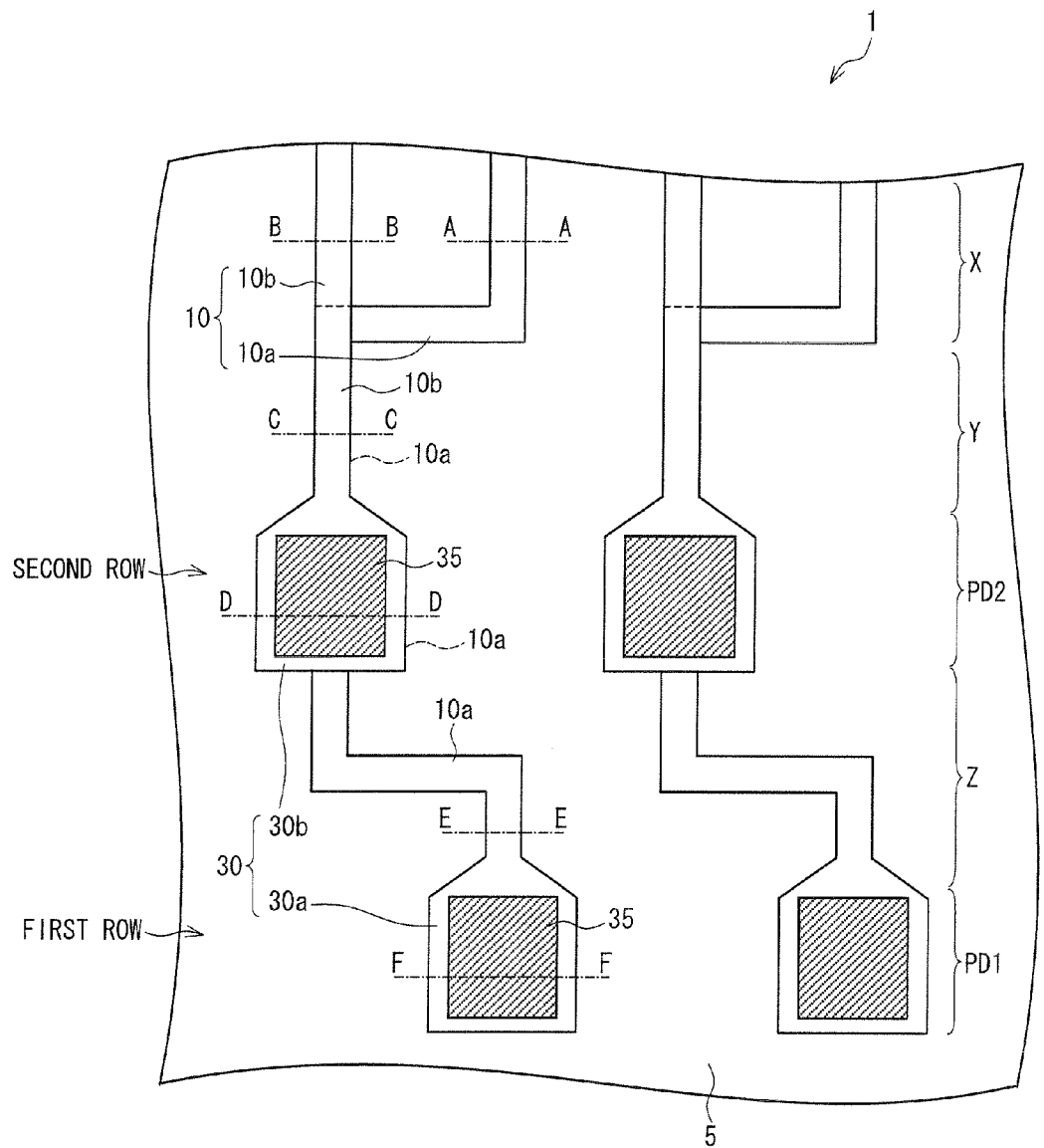
FIG. 1 illustrates an embodiment of the present invention, and is a view illustrating wiring on a wiring board.
Figure 18:
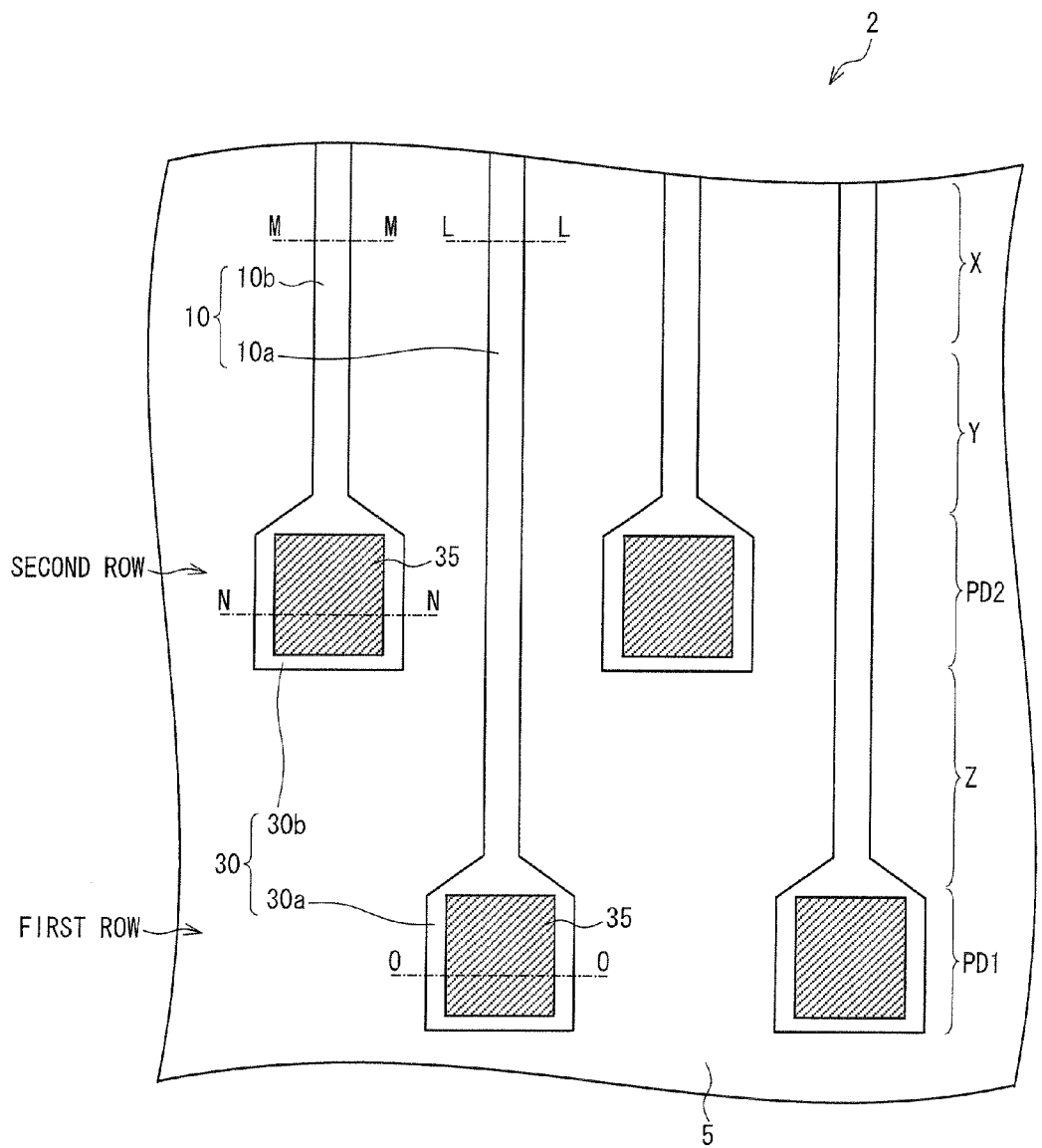
FIG. 18 illustrates a conventional technique, and is a view illustrating wiring provided on a wiring board.

FIG. 1 is a view illustrating wiring provided on a wiring board 1 of the present embodiment. Moreover, FIG. 18 is a view illustrating wiring provided on a conventional wiring board 2 on which a number of pads 30 same as the wiring board 1 are provided.

(Overall Configuration)

As illustrated in FIG. 1, the wiring board 1 of the present embodiment has, on a substrate 5: pads 30 serving as electrical connection points with electronic components such as an IC (Integrated Circuit: integrated circuit); metal wires 10 serving as connection wires connected to respective pads 30; and an insulating layer (not illustrated) used for insulating the pads 30 from the metal wires 10.

A part of the pads 30 on which no insulating layer is provided, in other words, an open part of the insulating layer on the pads 30 for electrically connecting with the electronic component, is a pad opening 35.

(Pads)

The pads 30 are provided on the wiring board 1 in a plurality of rows, more specifically, in a zigzag array. Namely, the pads 30 are provided on the substrate 5 in two rows ("first row" and "second row" illustrated in FIG. 1), and the pads 30 in each of the rows (first row pads 30a aligned as the first row and second row pads 30b aligned as the second row) have identical pad pitches. These pads 30a and 30b in the respective rows are disposed in such a manner that the pad pitch is shifted by half its pitch.

The pads 30 in the conventional wiring board 2 illustrated in FIG. 18 are also disposed in a similar manner. That is to say, as illustrated in FIG. 18, the conventional wiring board 2 also has the pads 30 separated into a first row and a second row, and is provided in a zigzag array by disposing the pads alternatively in shifted positions.

(Wiring)

The following description explains wires that extend to the pads 30.

In the conventional wiring board 2, wires are provided to the first row pads 30a by passing between the second row pads 30b, as illustrated in FIG. 18.

In comparison, in the wiring board 1 of the present embodiment, wires extending to the first row pads 30a are provided in such a manner that metal wires 10 (first metal wires 10a) serving as connection wires of the first row pads 30a pass through a lower layer region of the second row pads 30b, as illustrated in FIG. 1. In other words, the wires (first metal wires 10a) to the first row pads 30a do not pass between the second row pads 30b.

More specifically, the wiring board 1 of the present embodiment has each of the first metal wires 10a provided in a layer sandwiched between respective second row pads 30b and the substrate 5, in a region in which a second row pad 30b overlaps the first metal wire 10a. Further, a line width of the first metal wire 10a is of a same width as the second row pad 30b that overlaps the first metal wire 10a in the region.

Specifically how the wiring is provided is described below, with reference to a cross-sectional view of the wiring board 1 and the wiring board 2.

(Conventional Configuration)

As illustrated in FIG. 18, the conventional wiring board 2 provides, from a draw-out region (draw-out region X illustrated in FIG. 18) to each of the pads 30 (first row pads 30a in a first row pad region PD1 and second row pads 30b in a second row pad region PD2, each illustrated in FIG. 18), a first metal wire 10a connected to the first row pad 30a and a second metal wire 10b connected to the second row pad 30b in a same layer on the substrate 5. Further, this layer is covered by a same insulating layer (not illustrated), except for any regions that require no insulation such as a region to which another component is connected.

Figure 19:
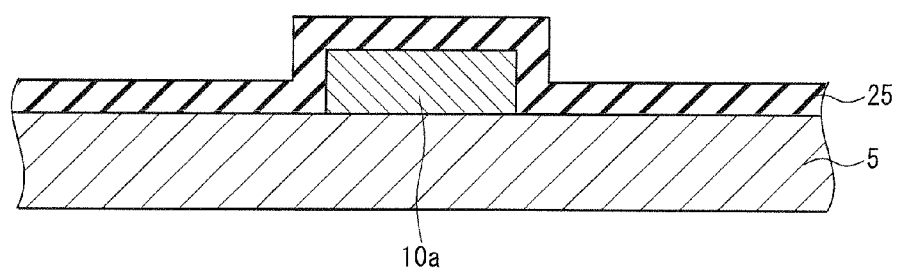
FIG. 19 is a view schematically illustrating a cross section taken along line L-L of FIG. 18.
Figure 20:
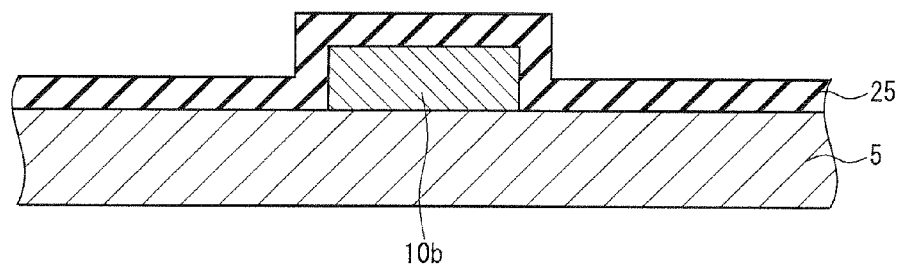
FIG. 20 is a view schematically illustrating a cross section taken along line M-M of FIG. 18.
Figure 23:
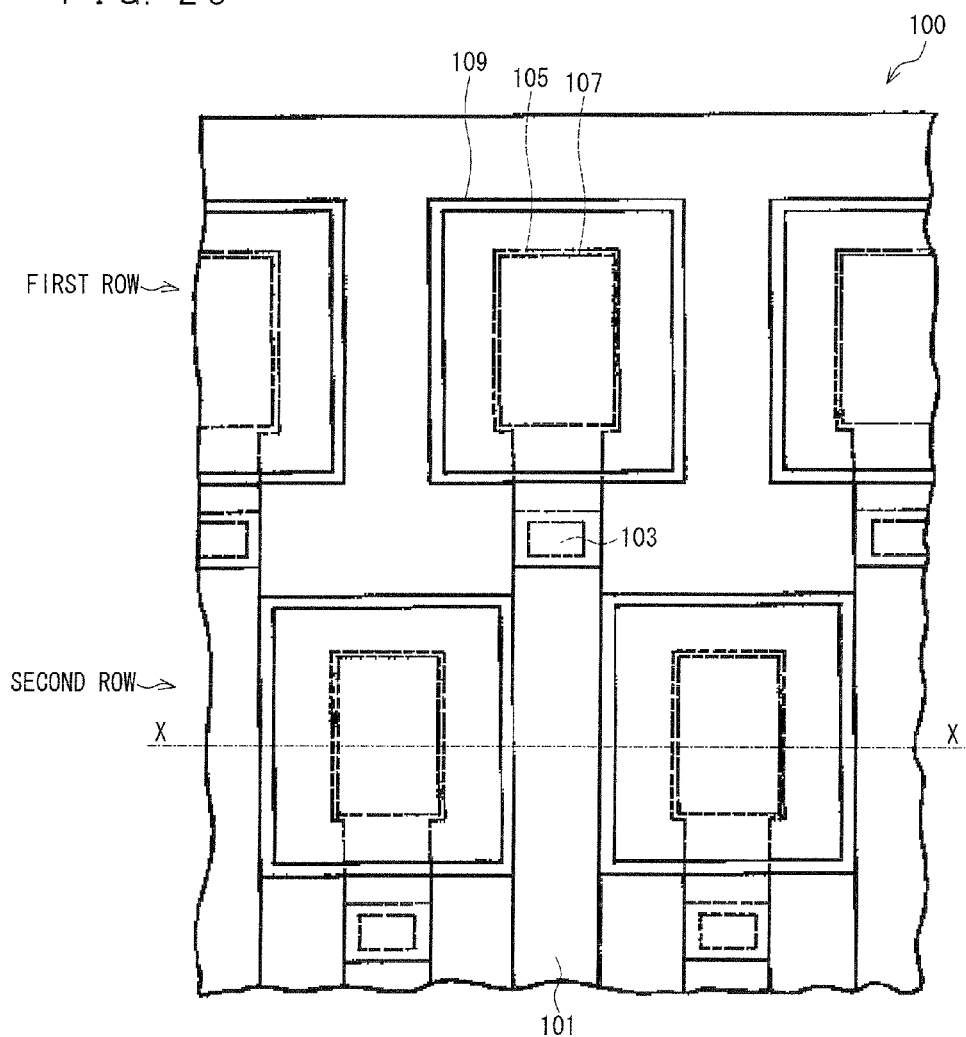
FIG. 23 is a view illustrating a configuration of a wiring board disclosed in Patent Literature 1.
Figure 24:
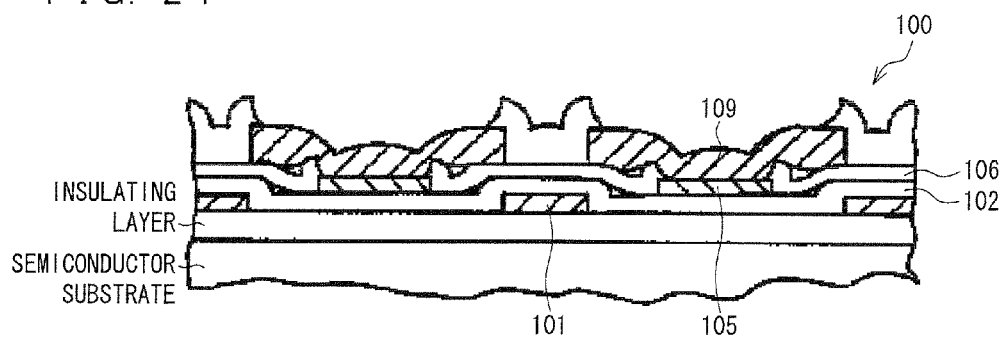
FIG. 24 is a cross-sectional view taken along line X-X of FIG. 23.
Figure 25:
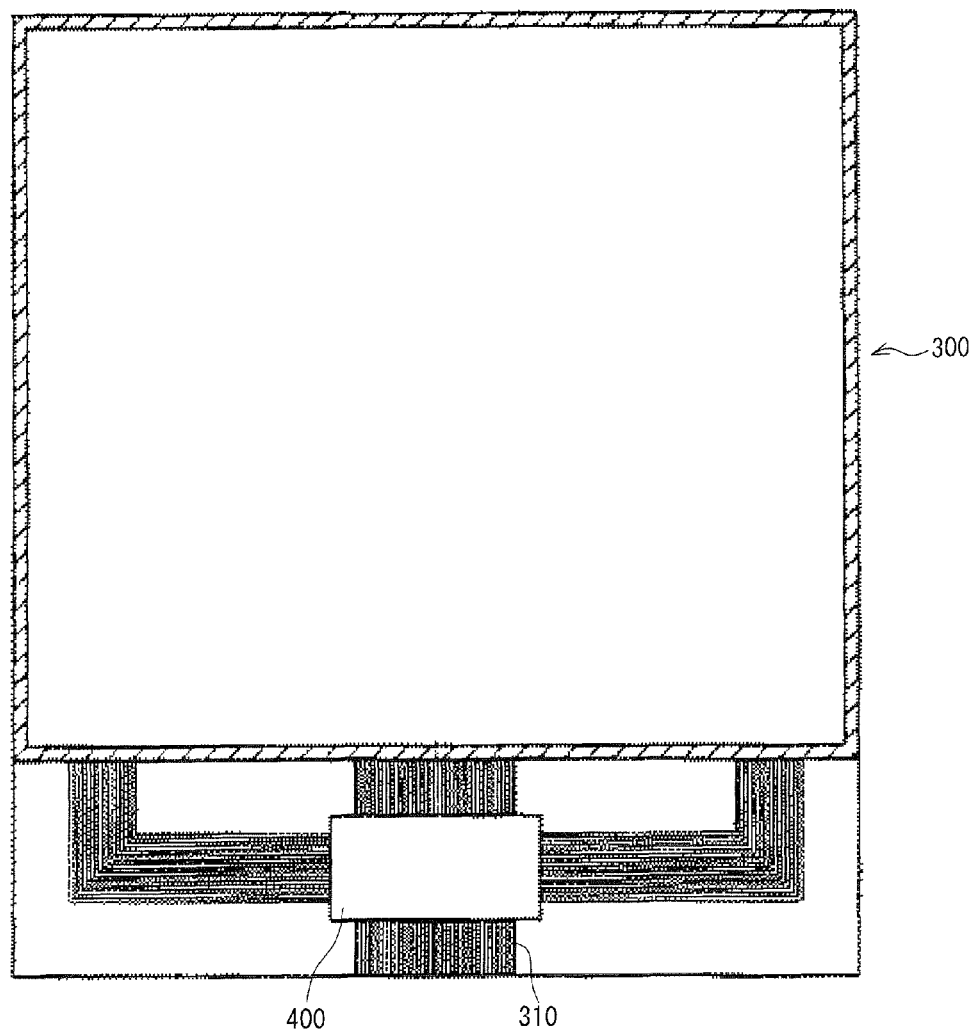
FIG. 25 is a view illustrating a configuration of a liquid crystal panel disclosed in Patent Literature 2.
Figure 26:
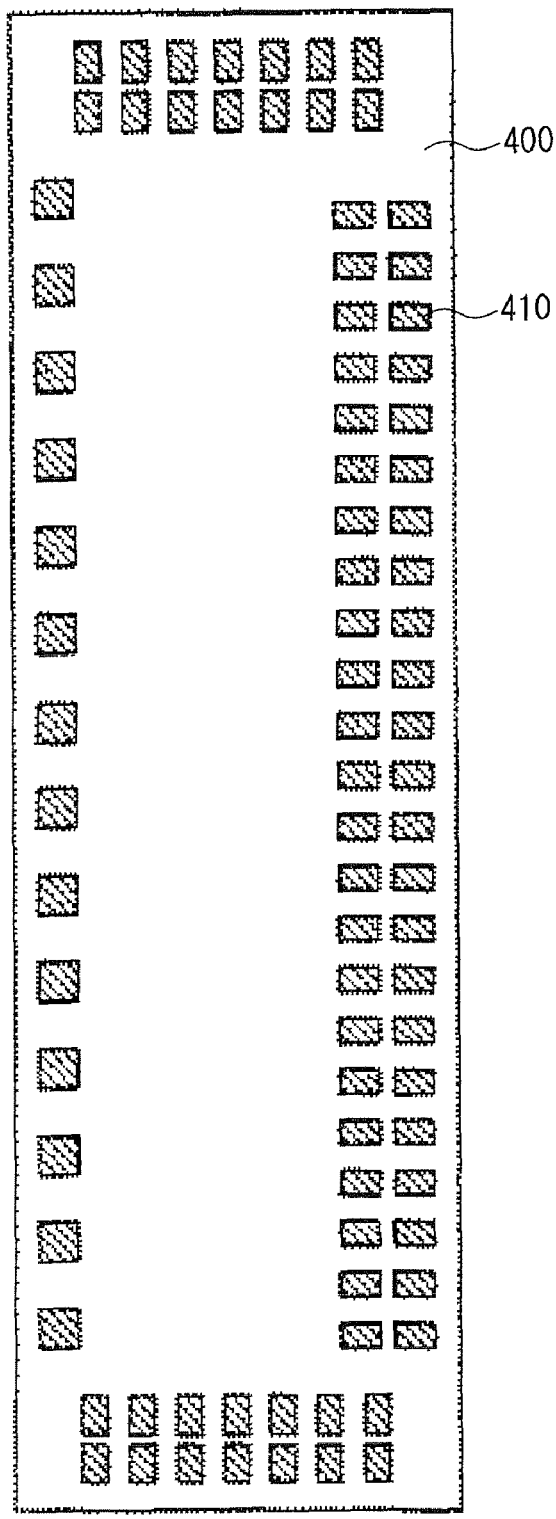
FIG. 26 is a view illustrating a configuration of a bottom side of a driving IC illustrated in FIG. 25.
Figure 27:
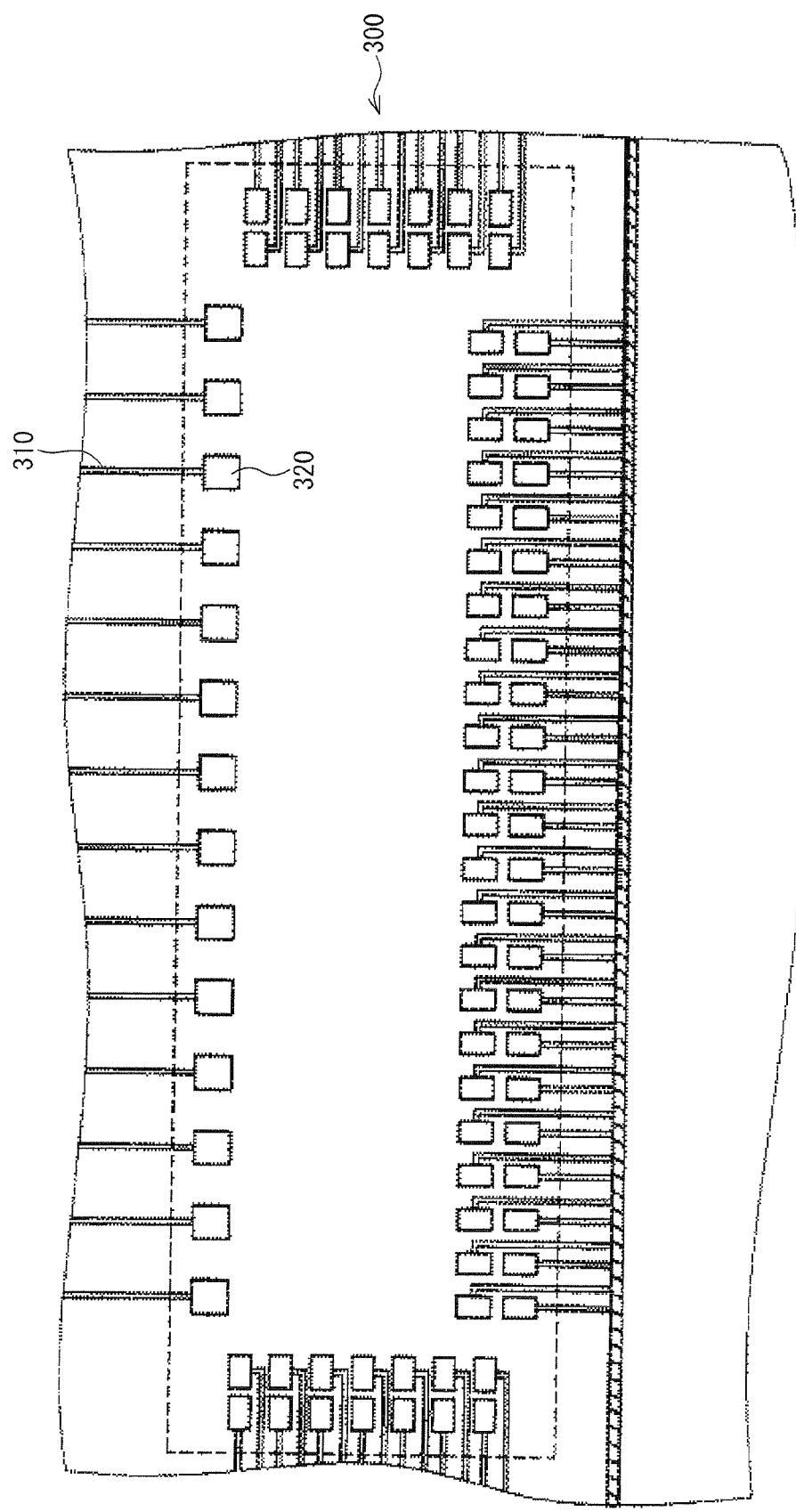
FIG. 27 is a view illustrating a liquid crystal display panel on which the driving IC illustrated in FIG. 26 is mounted.

The following is a description with reference to FIG. 19 which is a view illustrating a cross section of the first metal wire 10a in the draw-out region X (cross section taken along line L-L in FIG. 18), and FIG. 20 which is a view illustrating a cross section of the second metal wire 10b in the draw-out region X (cross section taken along line M-M in FIG. 18).

Namely, as illustrated in FIGS. 19 and 20, the conventional wiring board 2 has the first metal wires 10a and the second metal wires 10b provided on the substrate 5 in a same layer by use of a same material. Further, the first metal wires 10a and the second metal wires 10b are covered by a same insulating layer 25.

Present Embodiment

In comparison, in the wiring board 1 of the present embodiment, the first metal wire 10a connected to the first row pad 30a and the second metal wire 10b connected to the second row pad 30b are not disposed in a stacked manner in the draw-out region (region X illustrated in FIG. 1) on the substrate 5. However, in a second connection region (region Y illustrated in FIG. 1) in which the second row pad 30b is connected to the second metal wire 10b, the second metal wire 10b and the first metal wire 10a overlap each other. The description below explains this with reference to the drawings.

(Draw-Out Region X)

Figure 2:
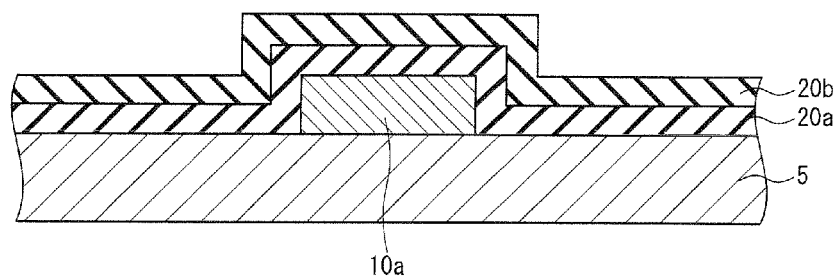
FIG. 2 is a view schematically illustrating a cross section taken along line A-A of FIG. 1.
Figure 3:
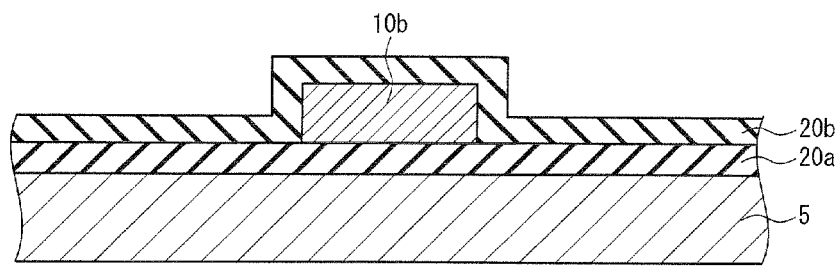
FIG. 3 is a view schematically illustrating a cross section taken along line B-B of FIG. 1.

FIG. 2 is a view illustrating a cross section (cross section taken along line A-A of FIG. 1) of the first metal wire 10a in the draw-out region X, and FIG. 3 is a view illustrating a cross section (cross section taken along line B-B of FIG. 1) of the second metal wire 10b in the draw-out region X.

As illustrated in FIG. 1, in the draw-out region X, the first metal wire 10a and the second metal wire 10b are disposed in different positions on the plane surface of the substrate 5, so that the wires 10a and 10b do not overlap each other when seen as a plan view.

Further, as illustrated in FIG. 2, the first metal wire 10a is covered by a first insulating layer 20a and a second insulating layer 20b.

On the other hand, the second metal wire 10b is, as illustrated in FIG. 3, covered by the second insulating layer 20b. Moreover, the first insulating layer 20a is sandwiched between the second metal wire 10b and the substrate 5.

This is because the wires and insulating layers are provided on the substrate 5 in the order of: first metal wire 10a, first insulating layer 20a, second metal wire 10b, and second insulating layer 20b.

Additionally, the first metal wire 10a and the second metal wire 10b are provided by use of different material. This is explained more specifically later.

(Second Connection Region Y)

Next described is the second connection region Y illustrated in FIG. 1.

The second connection region Y is a region approaching a region in which the second metal wire 10b is connected to the second row pad 30b. In the second connection region Y, the second metal wire 10b overlaps the first metal wire 10a in a thickness direction of the substrate 5, in other words, in a perpendicular direction to the substrate 5.

Figure 4:
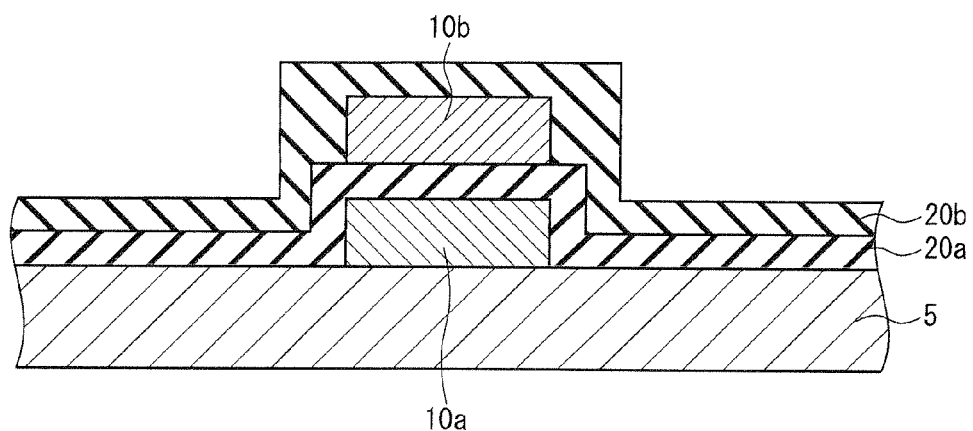
FIG. 4 is a view schematically illustrating a cross section taken along C-C in FIG. 1.

The following description is provided with reference to FIG. 4, which is a view illustrating a cross section of the first metal wire 10a and the second metal wire 10b in the second connection region Y (cross section taken along line C-C of FIG. 1).

As illustrated in FIG. 4, in the second connection region Y, the second metal wire 10b is provided in an upper layer of the first metal wire 10a. More specifically, the first metal wire 10a and the first insulating layer 20a that covers the first metal wire 10a are provided on the substrate 5, and thereafter the second metal wire 10b and the second insulating layer 20b that covers the second metal wire 10b are provided in a further upper layer of the first metal wire 10a and first insulating layer 20a.

(Another Configuration)

The configuration of metal wires in the draw-out region X and the second connection region Y is not limited to the foregoing configuration, and may be configured as in the following description.

Namely, in another configuration of the present embodiment, the wiring board 1 may have the first metal wire 10a connected to the first row pad 30a and the second metal wire 10b connected to the second row pad 30b be provided in a same layer on the substrate 5 in the draw-out region X.

Thereafter, in the second connection region Y in which the second row pad 30b is connected, the first metal wire 10a and the second metal wire 10b are provided in different layers. Below is a description thereof with reference to the drawings.

Figure 5:
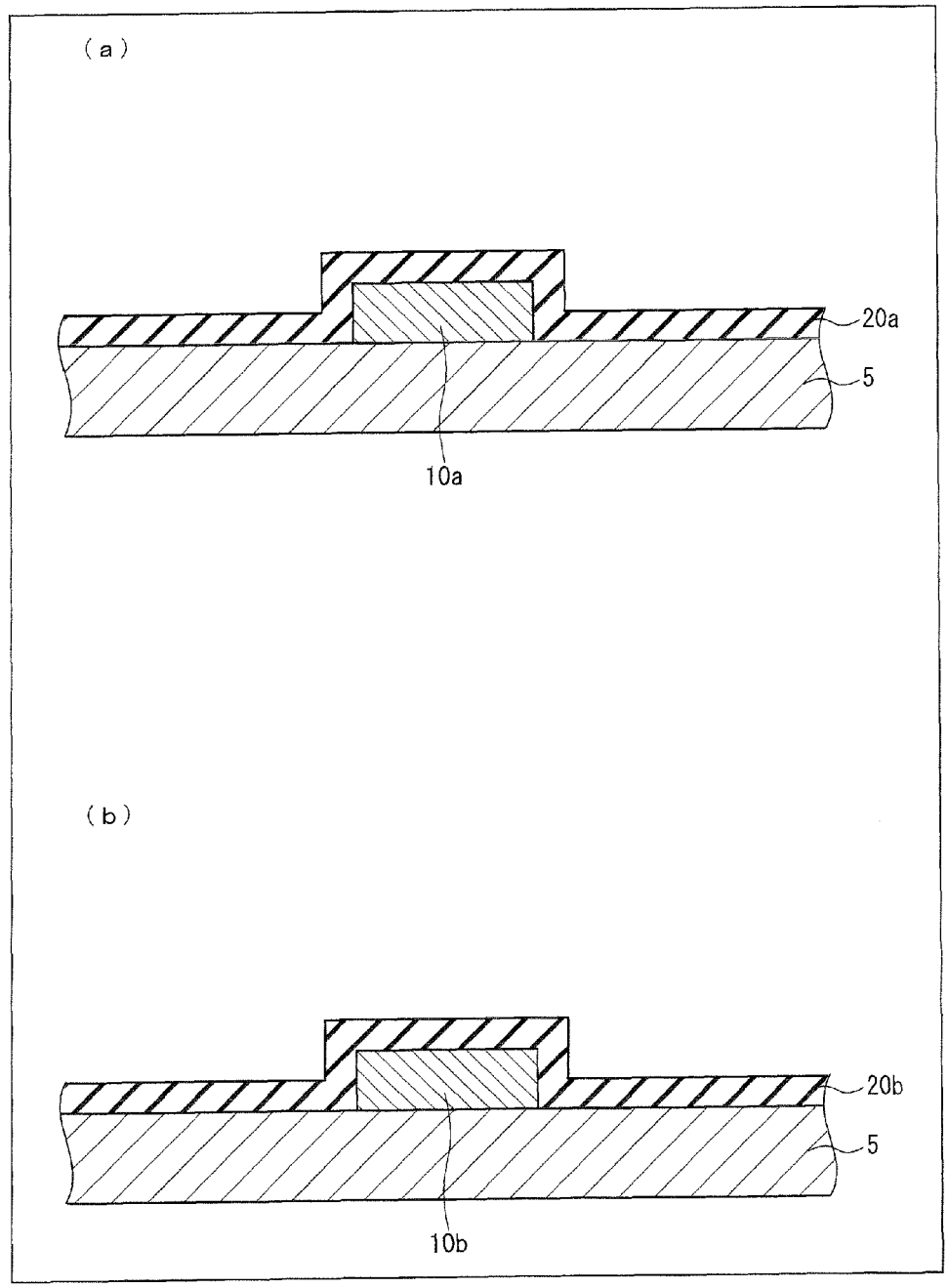
FIG. 5 is a view illustrating another configuration of an embodiment of the present invention; (a) is a view of its cross section taken along a line corresponding to line A-A of FIG. 1, and (b) is a view of its cross section taken along a line corresponding to line B-B of FIG. 1.

Views illustrated in (a) of FIG. 5 and (b) of FIG. 5 are cross sections of a wiring board 1 of another configuration of the present embodiment; (a) of FIG. 5 corresponds to the cross section taken along line A-A in FIG. 1, and (b) of FIG. 5 corresponds to the cross section taken along line B-B of FIG. 1.

As illustrated in (a) of FIG. 5 and (b) of FIG. 5, in the draw-out region X, although the first metal wire 10a and the second metal wire 10b are made of different material as later described, the first metal wire 10a and the second metal wire 10b are provided on a same layer on the substrate 5. Further, the first metal wire 10a is covered by the first insulating layer 20a, and the second metal wire 10b is covered by the second insulating layer 20b.

As described with reference to FIG. 4, in the second connection region Y, the second metal wire 10b overlaps the first metal wire 10a in a thickness direction of the substrate 5, in other words, in the perpendicular direction to the substrate 5. Note that the second connection region Y is a region approaching the region in which the second metal wire 10b is connected to the second row pad 30b.

(Second Row Pad Region PD2)

Next described is a pad 30 disposed in a second row pad region PD2, which second row pad region PD2 is a region in which the pads 30 (second row pad 30bs) in the second row are disposed, as illustrated in FIG. 1.

First, in the wiring board 1 of the present embodiment, the second row pads 30b which are the pads 30 disposed in the second row are formed by broadening a width of the second metal wire 10b and by having the second insulating layer 20b opened.

Figure 6:
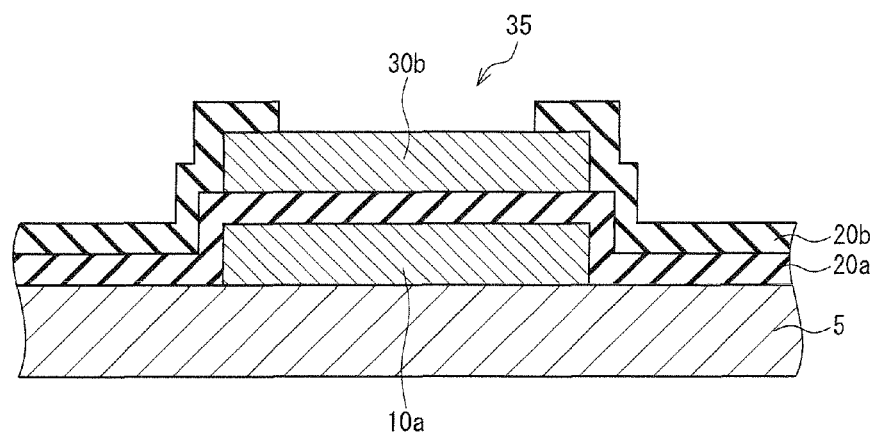
FIG. 6 is a view schematically illustrating a cross section taken along line D-D of FIG. 1.

FIG. 6 is a view illustrating a cross section of the second row pad 30b, which view corresponds to the cross section taken along line D-D of FIG. 1.

As illustrated in FIG. 6, the second row pads 30b are formed by broadening the line width of the second metal wire 10b in a layer configuration of the second connection region Y illustrated in FIG. 4.

Furthermore, one part of the second insulating layer 20b which covers the second metal wire 10b in FIG. 4 is opened, to provide a pad opening 35 in an upper layer of the second row pad 30b.

That is to say, the second row pad 30b of the present embodiment is provided on an extension of the second metal wire 10b, its width is broadened to enable electrical connection with an electronic component and the like, and an insulating layer provided on its surface layer is removed.

Further, the wiring board 1 of the present embodiment has, in the second row pad region PD2, the first metal wire 10a also increased in line width, as similar to the second metal wire 10b.

More specifically, as illustrated in FIG. 6, in the second row pad region PD2, the line width of the first metal wire 10a is expanded to have a same width as the second row pad 30b.

In other words, in the second row pad region PD2, the second row pad 30b overlaps the first metal wire 10a, and when seen as a plan view, both edges of the second row pad 30b in the width direction and both edges of the first metal wire 10a in the line width direction are in line with each other in an overlapping direction.

(Another Arrangement)

The edges of the first metal wire 10a in the line width direction and the edges of the second row pad 30b in the line width direction do not necessarily need to be in line with each other when seen as a plan view, and the line width of the first metal wire 10a can be somewhat narrower than the second row pad 30b. The description below describes this with reference to drawings.

Figure 7:
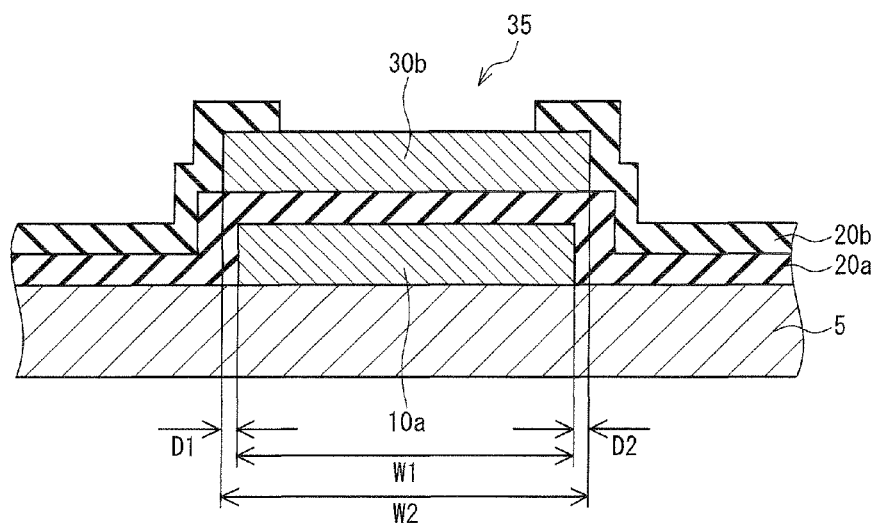
FIG. 7 is a view illustrating another configuration of an embodiment of the present invention, and is a view of its cross section taken along a line corresponding to line D-D of FIG. 1.

FIG. 7 is a view illustrating another configuration of an embodiment of the present invention, and is a view illustrating a cross section of the second row pad 30b, which cross section corresponds to the cross section taken along line D-D in FIG. 1.

In FIG. 7, W1 indicates a line width of the first metal wire 10a in a lower layer region of the second row pad 30b, and W2 indicates a width of the second row pad 30b.

Moreover, D1 and D2 denote a gap width (distance D between edges when seen as a plan view) between the edges of the second row pad 30b and respective edges of the first metal wire 10a when seen as a plan view.

In the configuration illustrated in FIG. 6, W1 (line width of first metal wire 10a)=W2 (width of the second row pad 30b), and further D1=0 um, and D2=0 um.

In the wiring board 1 of the present embodiment, W1 is not necessarily equal to W2, and for example, W1/W2 can be a value satisfying the following inequation: $0.8 \leq W1/W2 \leq 1$.

Moreover, similarly, D1 and D2 do not necessarily need to be 0 um and 0 um, respectively. For example, D1 can be a value satisfying the inequation: $0\ um \leq D1 \leq 1\ um$, or D2 can be a value satisfying the inequation: $0\ um \leq D2 \leq 1\ um$.

Furthermore, FIG. 7 illustrates, as another configuration of the present embodiment, a configuration in which the line width W1 of the first metal wire 10a is 13 um, the width W2 of the second row pad 30b is 15 um, the gap width D1 between edge surfaces of the first metal wire 10a and the second row pad 30b when seen as a plan view is 1 um, the gap width D2 similar to D1 is 1 um, and a ratio W1/W2 is 0.87, where the ratio W1/W2 is a ratio of the line width W1 of the first metal wire 10a to the width W2 of the second row pad 30b.

Why the line width of the first metal wire 10a and the like are preferably in the foregoing ranges are later described.

(Electrode Pad)

The configuration of the pads 30 in the second row is not limited to the configuration, and a pad electrode 32 can be provided additionally.

Figure 8:
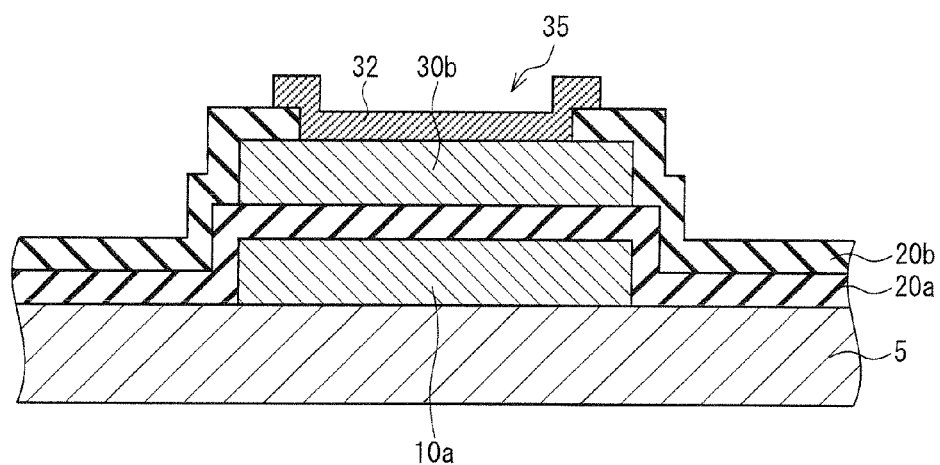
FIG. 8 is a view schematically illustrating a cross section of another embodiment of the present invention taken along line D-D of FIG. 1.

FIG. 8 is a cross-sectional view illustrating another configuration of a pad 30 disposed in the second row.

More specifically, as illustrated in FIG. 8, the second row pad 30b that is provided by broadening the width of the second metal wire 10b may have a pad electrode 32 be provided in an upper layer of the second row pad 30b, which pad electrode 32 is made of for example ITO (Indium Tin Oxide).

With the configuration, for example by forming the pad electrode 32 with a metal material different from the second metal wire 10b, it is possible to improve connection stability of the electronic component, and the like.

(Conventional Configuration)

In comparison to the configuration of the present embodiment, the conventional wiring board 2 has the line width of the second metal wire 10b be broadened to provide the second row pad 30b, and further the insulating layer 25 is opened to have the pad opening 35, as illustrated in FIG. 21 which is a cross-sectional view taken along line N-N of FIG. 18. Moreover, if necessary, the pad electrode 32 made of ITO is provided in an upper layer of the second row pad 30b.

(First Connection Region Z)

The following description explains the first metal wire 10a and the first row pad 30a.

In the wiring board 1 of the present embodiment, the first metal wire 10a is drawn out from a lower layer of the second row pad 30b to a first connection region (Z region illustrated in FIG. 1) which is a region approaching a region in which the first metal wire 10a is connected to the first row pad 30a.

Namely, connection of the draw-out region X and the first connection region Z are carried out without providing the wire between the second row pads 30b.

Here, in the second row pad region PD2, the first metal wire 10a is made narrow to a line width of the first metal wire 10a which has not been broadened to the width of the second row pad 30b yet, in other words, to a line width the same as the line width in the second connection region Y.

The first metal wire 10a made narrow in line width and drawn out to the first connection region Z is bent in course so that the first metal wire 10a can connect to a first row pad 30a disposed at a position shifted from the second row pad 30b according to the zigzag disposition, and thereafter is connected to the first row pad 30a.

Figure 9:
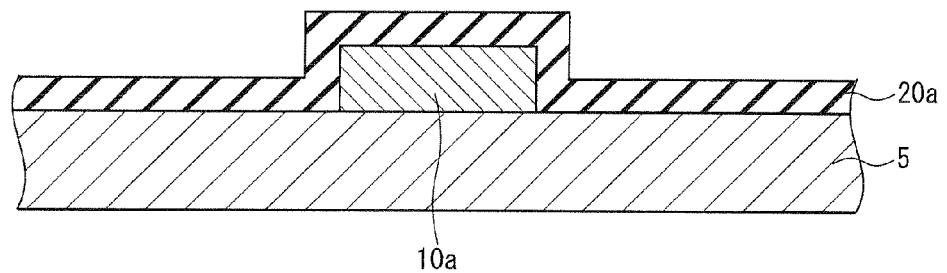
FIG. 9 is a view schematically illustrating a cross section taken along line E-E of FIG. 1.

FIG. 9 is a view illustrating a cross section (cross section taken along line E-E of FIG. 1) of the first metal wire 10a in the first connection region Z. As illustrated in FIG. 9, in the first connection region Z, the first metal wire 10a has its line width narrowed to a same line width as the line width in the second connection region Y, as described above with reference to FIG. 4.

Moreover, in the first connection region Z, the second metal wire 10b is not provided in an upper layer of the first metal wire 10a. This is because the second metal wire 10b is not extended any further once the second metal wire 10b is connected to the second row pad 30b.

In the configuration illustrated in FIG. 9, the first metal wire 10a is covered just by the first insulating layer 20a, however it is also possible, for example as illustrated in FIG. 2, to have the first metal wire 10a be covered by the first insulating layer 20a and the second insulating layer 20b.

(First Row Pad Region PD1)

Next described is a pad 30 disposed in a first row pad region PD1, which first row pad region PD1 is a region in which pads 30 (first row pads 30a) are provided in the first row, as illustrated in FIG. 1.

Figure 10:
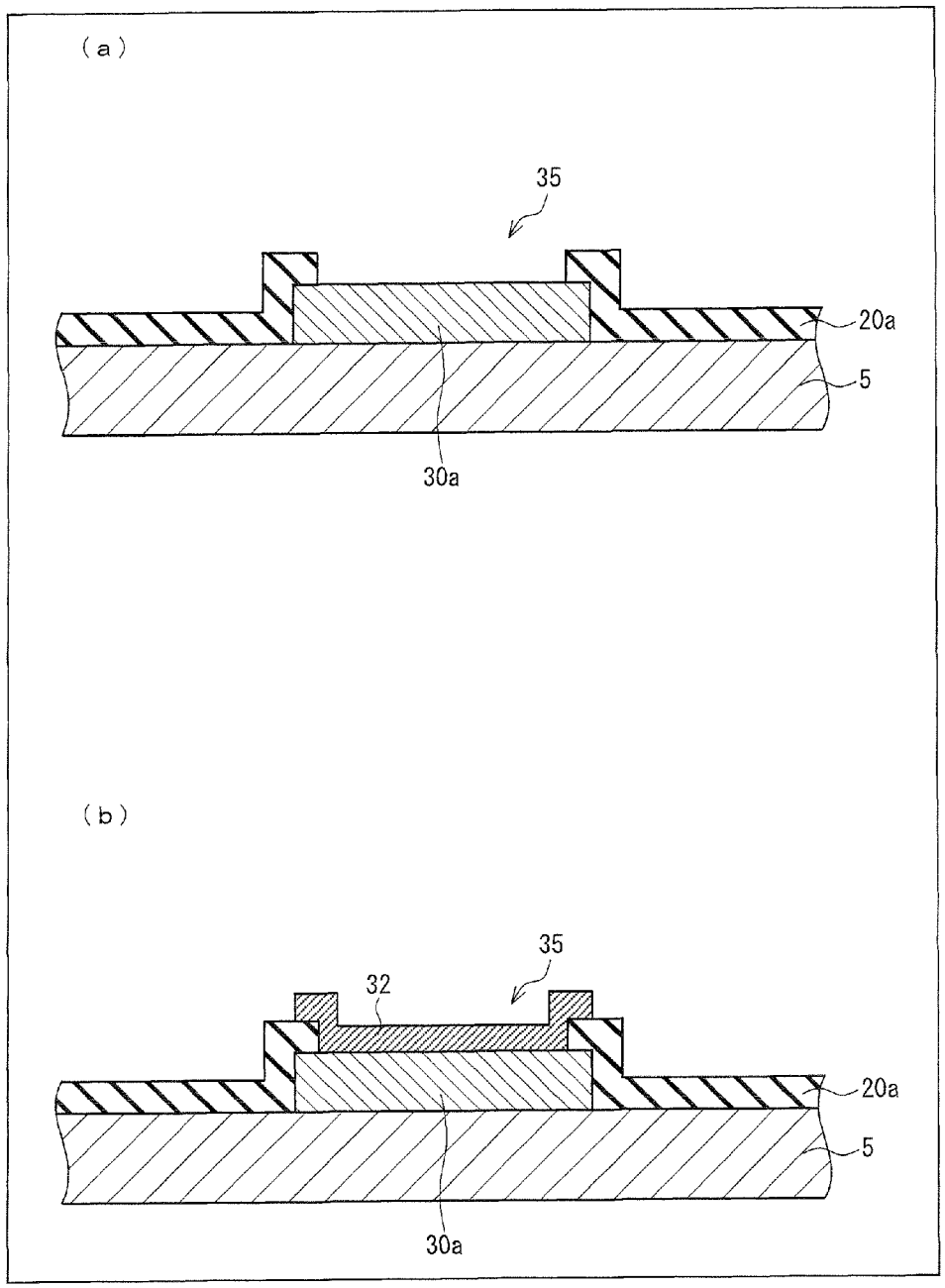
FIG. 10 is a view schematically illustrating a cross section taken along line F-F in FIG. 1; (a) illustrates a cross section of a first row pad, and (b) illustrates a cross section of another configuration of the first row pad.

Illustrated in (a) of FIG. 10 is a view of a cross section of the first row pad 30a (cross section taken along line F-F of FIG. 1). Moreover, (b) of FIG. 10 is a cross-sectional view illustrating another configuration of a pad 30 provided in the first row.

As illustrated in (a) of FIG. 10, the first metal wire 10a serves as the first row pad 30a in the first row pad region PD1 by again being broadened in line width.

In the upper layer of the first row pad 30a, the first insulating layer 20a is partially opened, to have a pad opening 35.

Moreover, as illustrated in (b) of FIG. 10, another configuration of the first row pad 30a may have a pad electrode 32 made of ITO or the like provided in an upper layer of the first row pad 30*a*. Each of the configurations is similar to those of the second row pad 30*b* explained before.

(Conventional Configuration)

The configuration of the first row pad 30*a* in the present embodiment is substantially similar to the configuration of the conventional wiring board 2.

FIG. 22 is a view illustrating a cross section (cross section taken along line 0-0 of FIG. 18) of a first row pad 30*a* in the conventional wiring board 2.

As illustrated in FIG. 22, the first row pad 30*a* in the conventional wiring board 2 has the first metal wire 10*a* be broadened in width, and also has an opening in the insulating layer 25 in its upper layer, similarly to the first row pad 30*a* of the present embodiment. Moreover, if necessary, the pad electrode 32 is provided in an upper layer of the first row pad 30*a*.

(Bad Leakage: Case 1)

As described above, the wiring board 1 of the present embodiment has the first metal wire 10*a* provided so that a center in its line width direction is positioned in the lower layer region of the second row pad 30*b*, and is not provided between adjacent second row pads 30*b*.

Therefore, it is difficult for the bad leakage to occur in the wiring board 1 of the present embodiment, while the wiring board 1 of the present embodiment can attain a narrow pitch of the pads, even in a case where, at a time of mounting, misalignment occurs between for example the electronic component and the pad, particularly in a case where the power applied to the pad at the time of mounting is great. The following description deals with why this is possible.

Namely, in the wiring board 1 of the present embodiment, the first metal wire 10*a*, with respect to its line width direction, is provided not between adjacent second row pads 30*b* but provided in a lower layer region of the second row pad 30*b*.

Therefore, it is possible to prevent the second row pad 30*b* and a corner section of the first metal wire 10*a* disposed between the adjacent second row pads 30*b* from being close to each other and being easily made in contact with each other.

Figure 28:
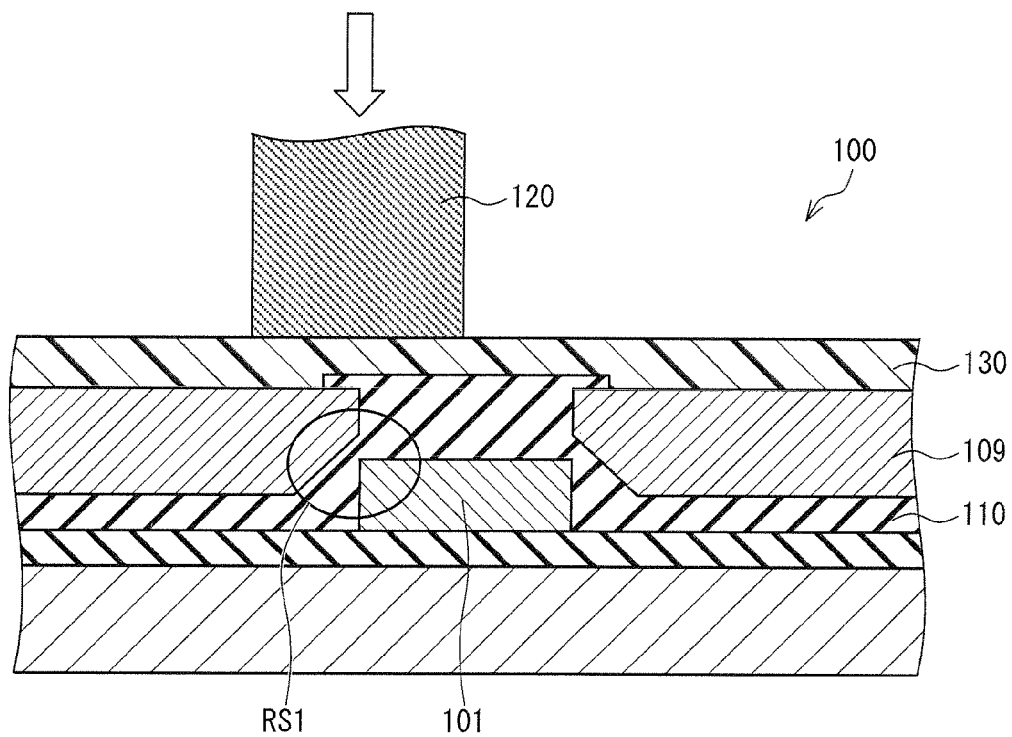
FIG. 28 is a view illustrating how an IC is mounted on a wiring board in a state in which the IC is misaligned.

Namely, as described above with reference to FIG. 28, the second row pad 30*b* easily comes into contact with the first metal wire 10*a* in a case where the first metal wire 10*a* is provided between adjacent second row pads 30*b*, and spaces between the second row pads 30*b* and the first metal wire 10*a* are narrowed to attain a narrow pitch of the second row pads 30*b*.

Meanwhile, the wiring board 1 of the present embodiment has the first metal wire 10*a* provided in a lower layer region of the second row pad 30*b*. Hence, it is possible to prevent occurrence of bad leakage caused by the second row pad 30*b* being in contact with the corner part of the first metal wire 10*a*.

(Narrow Pitch)

Moreover, in the present embodiment, when focusing on line width direction of the first metal wire 10*a*, the first metal wire 10*a* is provided to fit in the lower layer region of the second row pad 30*b*, and no first metal wire 10*a* is provided between adjacent second row pads 30*b*.

Therefore, the present embodiment requires no broadening of the distance between adjacent second row pads 30*b*, as with the conventional configuration, in order to prevent the second row pads 30*b* from being in contact with the first metal wire 10*a* which is a connection wire of the first row pad 30*a* provided between the adjacent second row pads 30*b*.

Hence, it is easy to narrow the pitch of the pads with the wiring board 1 of the present embodiment.

As described above, with the wiring board 1 of the present embodiment, it is difficult for the bad leakage (case 1) to occur, and further is possible to attain a narrow pitch of the pads.

(Another Configuration)

Figure 11:
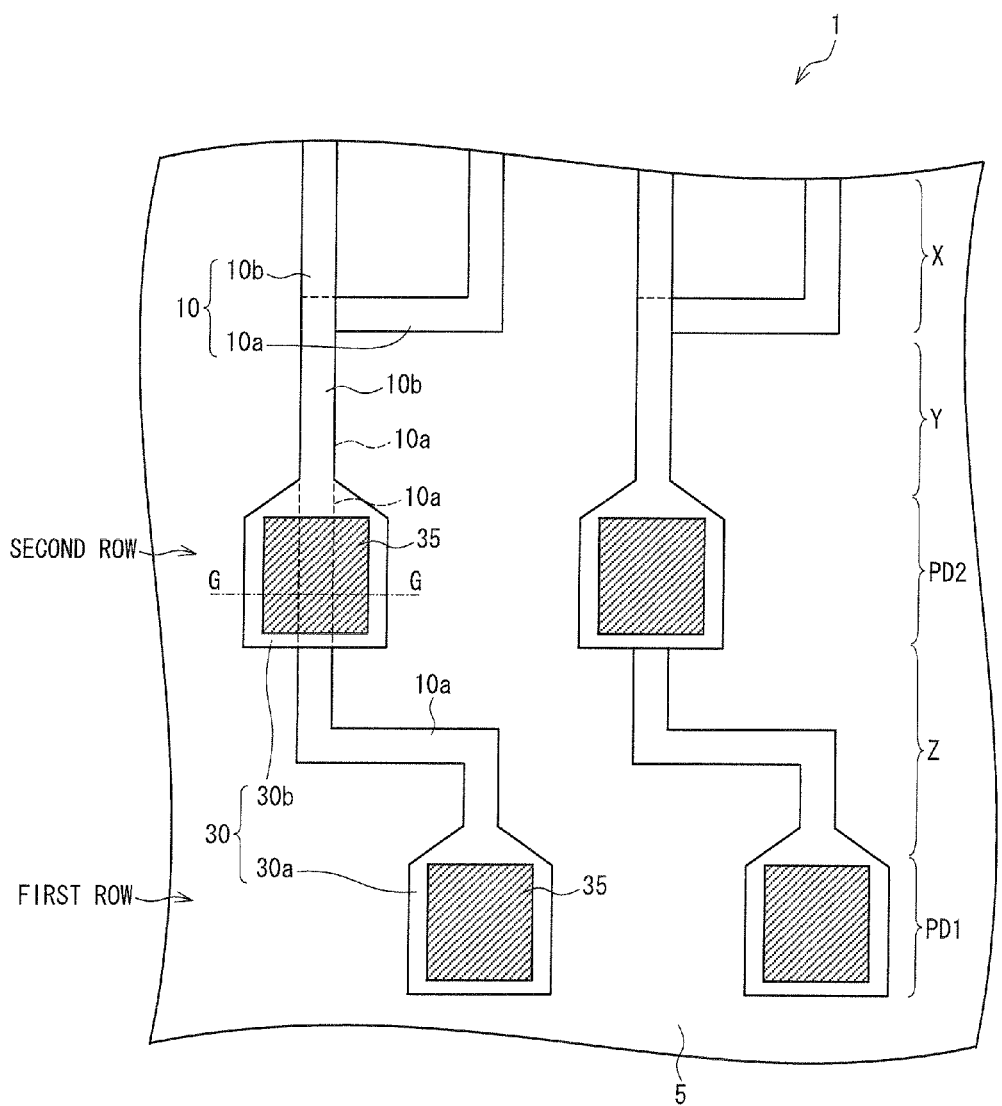
FIG. 11 is a view illustrating how wiring is provided on a wiring board on which pads are provided in a zigzag array.

One example of a configuration allowing prevention of occurrence of the bad leakage (case 1) explained above with reference to FIG. 28, without obstructing the attainment of a narrow pitch, is a configuration illustrated in FIG. 11.

FIG. 11 is a view illustrating how wiring is arranged on a wiring board on which two rows of pads are provided in a zigzag array form.

Similarly to the wiring board 1 illustrated in FIG. 1, the configuration illustrated in FIG. 11 has the first metal wire 10*a* provided between the second row pad 30*b* and the substrate 5 and not between second row pads 30*b* adjacent to each other when seen as a plan view.

Therefore, as described above, it is also possible with the configuration illustrated in FIG. 11 to narrow the pitch of the second row pad 30*b* and to prevent the occurrence of the bad leakage (case 1).

(Bad Leakage: Case 2)

However, the configuration illustrated in FIG. 11 may cause another bad leakage (case 2). This point is described in details below.

FIG. 12 is a view schematically illustrating a cross section taken along line G-G of FIG. 11. As illustrated in FIG. 12, the wiring board 1 illustrated in FIG. 11 has a line width of the first metal wire 10*a* sufficiently narrower than the width of the second row pad 30*b*, in the second row pad region PD2 in which the first metal wire 10*a* and the second row pad 30*b* are stacked.

This is because, in the configuration illustrated in FIGS. 11 and 12, the line width of the first metal wire 10*a* in the second row pad region PD2 is the same as the line width of the first metal wire 10*a* in the first connection region Z and the second connection region Y, and the line width is not particularly broadened in the second row pad region PD2.

With the configuration illustrated in FIGS. 11 and 12, there are cases where bad leakage (case 2) occurs caused by sinking down or the like of the second row pad 30*b*. The following describes this with reference to FIGS. 12 and 13.

The second row pad 30*b* is mounted with electronic components such as a driving IC, as described above. More specifically, a bump 120 of the electronic component is compression bonded to the second row pad 30*b* (in details, to the pad electrode 32 provided on the second row pad 30*b*) in a direction illustrated by the arrow in FIG. 12, to attain electric connection between the electronic component and the second row pad 30*b*.

Here, when the electronic component is mounted, there are cases where the second row pad 30*b* deforms caused by a strong pressing force (see the arrow) applied to the second row pad 30*b* from the bumps 120 of the electronic component in the direction of the substrate 5, which force acts on the second row pads 30*b*.

Figure 13:
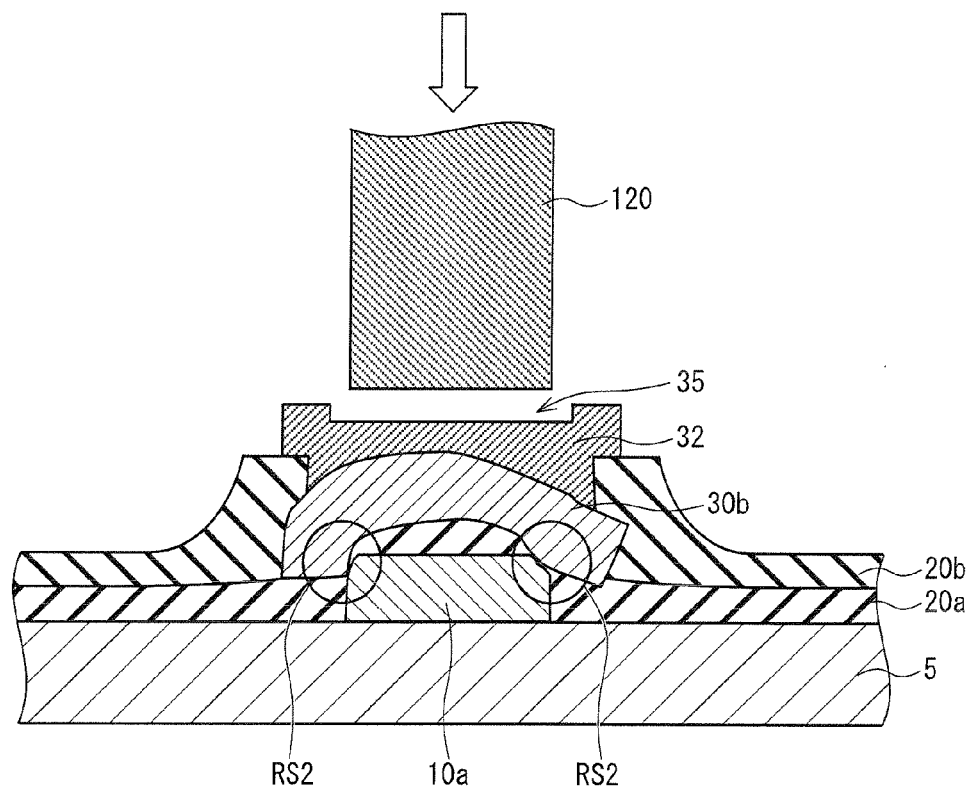
FIG. 13 is a view illustrating how an electronic component is mounted on a wiring board.

FIG. 13 is a view illustrating how an electronic component is mounted on the wiring board. More specifically, FIG. 13 is a cross-sectional view illustrating how the second row pad 30*b* is deformed by receiving the force from the bump 120 of the electronic component.

As illustrated in FIG. 13, when the electronic component is mounted, in a case where the force to push the bump 120 of the electronic component to the second row pad 30*b* is particularly strong or the like, both edges of the second row pad 30*b* may bend so that the second row pad 30*b* becomes a grooved shape, having its edges approach closer to the substrate 5. In a case where the bend is great, the first insulating layer 20a sandwiched between the second row pad 30b and the first metal wire 10a may break. As a result of such a break, the second row pad 30b and the first metal wire 10a are made to be in contact with each other, thereby causing bad leakage. The contact between the second row pad 30b and the first metal wire 10a easily occurs at a region in the vicinity of corner sections of both edges of the first metal wire 10a (short region RS2 illustrated in FIG. 13).

As described above, other than the bad leakage of case 1, there is also a bad leakage (case 2) which is caused by having the pad and a corner section of the connection wire provided in a region immediately under the pad be in contact with each other.

Although the configuration illustrated in FIG. 11 can prevent the occurrence of bad leakage of case 1 as described above with reference to FIG. 28 without obstructing the attainment of a narrow pitch, this configuration can cause occurrence of the bad leakage of case 2 described with reference to FIG. 13 in cases such as a case where the force applied to the pad from the electronic component at the time of mounting is particularly strong.

In the foregoing description, the bad leakage of case 2 is described by using an example in which the second row pad 30b formed by broadening the width of the second metal wire 10b has a pad electrode 32 provided in an upper layer of the second row pads 30b, with reference to FIG. 13. Here, the bad leakage of case 2 can similarly occur in a configuration in which the pad electrode 32 is not provided, as illustrated in FIG. 14. FIG. 14 is a view of another configuration, corresponding to a cross section taken along line G-G of FIG. 11.

Present Embodiment

In comparison, with the wiring board 1 of the present embodiment illustrated in FIG. 1, it is possible to prevent occurrence of not only the bad leakage of the case 1 but also the bad leakage of case 2. Reasons for this are explained below.

In the wiring board 1 of the present embodiment, the first metal wire 10a and the second row pad 30b have equal widths in the second row pad region PD2, and both edges of the first metal wire 10a and second row pad 30b in the width direction are in line with each other, when seen as a plan view.

That is to say, the line width of the first metal wire 10a in the second row pad region PD2 is broader than its line width in the first connection region Z and in the second connection region Y, and the first metal wire 10a has its most widest width within a range that it does not extend out from the second row pad 30b when seen as a plan view.

Therefore, even in a case where a strong force to press the second row pad 30b is applied to the second row pad 30b from the bump 120 of the electronic component or the like towards the direction of the substrate 5 at a time when the electronic component is mounted to the wiring board 1, it is difficult for the second row pad 30b to be made into contact with the first metal wire 10a that is provided in its lower layer. As a result, it is difficult for the bad leakage of case 2 to occur.

That is to say, as described before with reference to FIG. 13, the bad leakage of the case 2 readily occurs due to deformation of the second row pad 30b, which deformation occurs due to force applied to the second row pad 30b, thereby causing the second row pad 30b to be in contact with the first metal wire 10a.

Further, the contact of the second row pad 30b with the first metal wire 10a caused by the deformation of the second row pad 30b easily occurs in a case where the width of the second row pad 30b is sufficiently wider than the width of the first metal wire 10a provided in a lower layer of the second row pad 30b (the width of the first metal wire 10a is sufficiently narrower than the width of the second row pad 30b). This sufficiently wide second row pad 30b easily allows bending of the second row pad 30b in a grooved shape in the direction towards the substrate 5 due to the force, and as a result causes the bent second row pad 30b to be made into contact with corner sections of both the edges of the first metal wire 10a.

In comparison, in the configuration of the present embodiment, the width of the first metal wire 10a is the same as that of the second row pad 30b in its upper layer, for example as illustrated in FIG. 6 or FIG. 8. In other words, the second row pad 30b is disposed so that its entire pad is stacked on the first metal wire 10a.

Hence, even if a strong force pushing in the direction towards the substrate 5 is applied to the second row pad 30b at the time when the electronic component is mounted, it is difficult for the second row pad 30b to bend in a grooved shape for example in the direction towards the substrate 5. As a result, the first insulating layer 20a which is an insulating layer in the lower layer of the second row pad 30b, has less possibility of breaking. This reduces the occurrence of contact (electrical short-circuit) between the second row pad 30b and the corner sections of both edges of the first metal wire 10a provided in the lower layer region of the second row pad 30b, thereby making it difficult for the bad leakage of case 2 described with reference to FIG. 13 to occur.

As described above, the wiring board 1 of the present embodiment possibly prevents not just the occurrence of bad leakage of case 1 but also the occurrence of bad leakage of case 2 that occurs due to deformation of the second row pad 30b, which deformation causes the second row pad 30b to be in contact with the first metal wire 10a in the lower layer of the second row pad 30.

Hence, the wiring board 1 of the present invention has a low possibility of bad leakage occurrence while also being able to narrow its pad pitch, even if misalignment occurs at the time of mounting or particularly in a case where a strong force is applied to the pad at the time of mounting.

(Another Configuration)

The foregoing description explains a configuration illustrated in FIG. 6, that is, a configuration in which a line width W1 of the first metal wire 10a and a width W2 of the second row pad 30b are of the same width, and which both edges of the first metal wire 10a in width directions are in line with respective edges of the second row pad 30b, when seen as a plan view.

However, the configuration that can prevent the bad leakage of case 2 is not limited to the foregoing configuration, and may also be configured as described with reference to FIG. 7, for example.

That is to say, an edge of the first metal wire 10a in a line width direction and an edge of the second row pad 30b do not necessarily need to be in line with each other, when seen as a plan view. It is still possible to prevent the occurrence of the bad leakage of case 2 even in a configuration in which the line width of the first metal wire 10a is somewhat narrower than the width of the second row pad 30b.

More specifically, it is possible to prevent the bad leakage of case 2 even with a configuration in which the W1/W2 is within the range of $0.8 \leq W1/W2 \leq 1$, for example including the configuration described before with reference to FIG. 7.

Moreover, similarly, D1 and D2 do not necessarily need to be 0 um and 0 um, respectively. Similar effects are attainable even with a configuration in which, for example, D1 is $0 \text{ um} \leq D1 \leq 1 \text{ um}$, or D2 is $0 \text{ um} \leq D2 \leq 1 \text{ um}$.

In the configuration, the width of the second row pad 30b is insufficiently wider than the width of the first metal wire 10a provided in the lower layer of the second row pad 30b. Hence, even if pressing force is applied at the time of the mounting, it is possible to hold down the deformation of the second row pad 30b.

(COG)

Effect of preventing occurrence of the bad leakage is remarkable in a case where the wiring board 1 of the present embodiment is used in a chip-on-glass connection. In the embodiment, the chip-on-glass (COG: Chip On Glass) connection denotes a connection that mounts components such as a semiconductor chip directly on a glass substrate.

More specifically, for example this applies to a case where a glass substrate for use in a liquid crystal display device serves as the wiring board 1, and chip components such as a driving IC is directly mounted to the glass substrate for use in a liquid crystal display device.

With this chip-on-glass connection, the chip component is directly mounted on the pad provided on the glass substrate. As a result, less stress relaxation occurs between layers, thereby causing the insulating layer to be more breakable. Therefore, for example when misalignment occurs particularly at the time of mounting, bad leakage easily occurs between the pad and the connection wire.

In comparison, the wiring board 1 of the present embodiment has the first metal wire 10a provided in the lower layer of the second row pad 30b as described above, and both edges of the first metal wire 10a in the line width direction are in line with both edges of the second row pad 30b in the width direction, when seen as a plan view.

In other words, with the wiring board 1 of the present embodiment, both edges of the first metal wire 10a are in line with both edges of the second row pad 30b, and the first metal wire 10a is not extending out from the second row pad 30b. Hence, it is possible to prevent the occurrence of the bad leakage.

That is to say, no wire is provided between the second row pads 30b; even if misalignment occurs at the time when the driving IC is mounted on the wiring board 1, an electrical short-circuit does not easily occur between the second row pad 30b and the first metal wire 10a. As a result, it is possible to prevent the occurrence of the bad leakage.

(Another Configuration of Pads)

The first row pads 30a and the second row pads 30b may be provided by expanding the width of the first metal wires 10a and the second metal wires 10b. Alternatively, the first row pads 30a and the second row pads 30b may be formed, for example, by material different from the materials used for the first metal wires 10a and second metal wires 10b, or may be formed in different layers from the first metal wire 10a and second metal wires 10b.

(Metal Material)

Next described is metal material used for forming the metal wires (first metal wires 10a, second metal wires 10b) and the pads (first row pads 30a, second row pads 30b).

The wiring board 1 of the present embodiment, as described with reference to FIG. 6, has the first metal wires 10a provided in a lower layer of the second row pads 30b.

In the present embodiment, the second row pads 30b are preferably formed by use of material different from that of the first metal wires 10a.

In the present embodiment, the second row pad 30b is formed by expanding the line width of a respective second metal wire 10b in extension of the second metal wire 10b. Hence, the second row pad 30b and the second metal wire 10b are made of the same material.

TABLE 1

|  | Combination 1 | Combination 2 | Combination 3 | Combination 4 |
|---|---|---|---|---|
| Second Row Pad | Al | Al | Al | Ti |
| First Metal Wire | Ti/TiN | Ta/TaN | Ni | Ni |
| First/Second Insulating Layer | SiN, SiO$_2$ | SiN, SiO$_2$ | SiN, SiO$_2$ | SiN, SiO$_2$ |

Table 1 shows materials used for the second row pad 30b and first metal wire 10a, and the materials used for the first insulating layer 20a and second insulating layer 20b.

As shown in Table 1, with the wiring board 1 of the present embodiment, comparison of the material of the second row pad 30b with that of the first metal wire 10a shows that the material of the second row pad 30b is softer than the material of the first metal wire 10a.

In other words, a metal hardness (Mohs hardness) is generally in the order of Ni>Ti>Al. For example, if combination 1 in Table 1 is used, that is, in a case where the second row pad 30b is formed with Al (aluminum) and the first metal wire 10a is formed with an alloy of Ti (titanium) and TiN (titanium nitride), the material for the second row pad 30b is softer than that of the first metal wire 10a.

Moreover, the foregoing relationship that the material of the second row pad 30b is softer than that of the first metal wire 10a is similarly achieved with the other combinations 2, 3, and 4.

According to such a configuration, the material used for the second row pad 30b disposed in an upper layer is softer than the material used for the first metal wire 10a provided in the lower layer. Hence, it is difficult for the bad leakage to occur caused by having the second row pad 30b be in contact with the first metal wire 10a in the lower layer.

In other words, at a time when an IC or the like is mounted on the second row pad 30b, a pressing force is applied in a direction towards the substrate 5, for example, from a bump of the IC to a laminate of the second row pad 30b and the first metal wire 10a.

Caused by this force, it is assumed that the second row pad 30b of the upper layer and the first metal wire 10a of the lower layer are caused to come in contact with each other. According to the configuration, the second row pad 30b in the upper layer is softer than the first metal wire 10a in the lower layer. Hence, the force is relaxed (stress relaxed) at the second row pad 30b in the upper layer, and as a result, it is difficult for the second row pad 30b to be in contact with the first metal wire.

(Position of Pads)

The configuration of the wiring board 1 of the present invention is not limited to the foregoing configurations. For example, another embodiment of the present invention includes a configuration in which positions of the first row pads 30a and second row pads 30b are modified.

Namely, the foregoing embodiment describes a wiring board 1 in which the first row pads 30a and the second row pads 30b are provided in a zigzag array form as illustrated in FIG. 1. However, the wiring board 1 of the present invention is not limited to this configuration.

Figure 15:
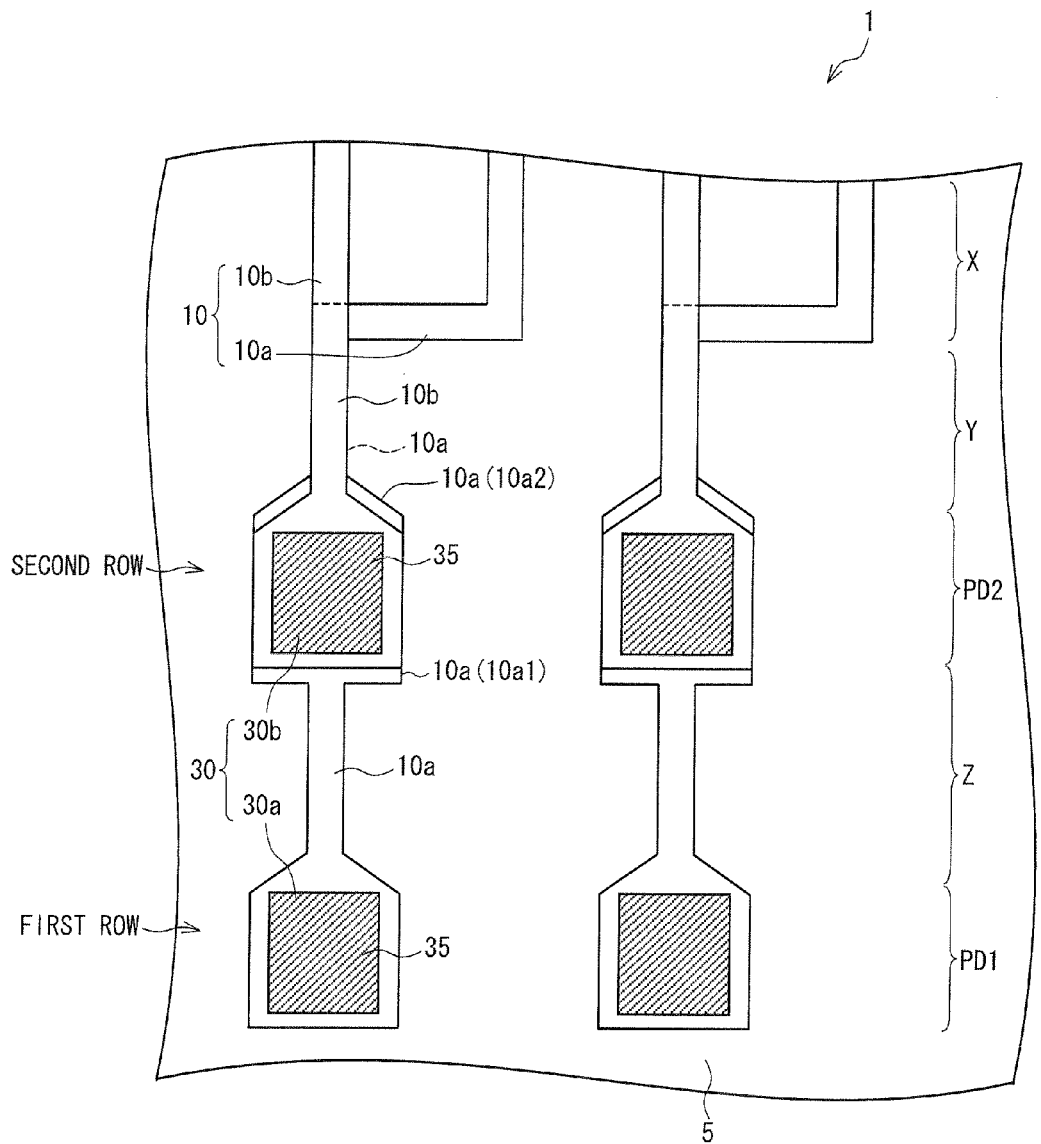
FIG. 15 illustrates another embodiment of the present invention, and is a view illustrating wiring on a wiring board.

FIG. 15 is a view illustrating a plan view of wiring of a wiring board 1 in another configuration of the present invention.

As illustrated in FIG. 15, the first row pad 30a and the second row pad 30b can be provided not in a zigzag array form but in one straight line, for example.

Moreover, FIG. 1 illustrates a configuration that the first metal wire 10a is drawn out from the second row pad region PD2 in such a manner that the first metal wire 10a is drawn out to the first connection region Z from a lower layer region of the second row pad 30b, so that the first metal wire 10a has a line width same as the line width of the first metal wire 10a in the second connection region Y.

Namely, in the foregoing configuration, the line width of the first metal wire 10a is the same between that in the second connection region Y and that in the first connection region Z, and the line width is to be expanded in width just in the second row pad region PD2, to have the same width as the width of the second row pad 30b.

On the other hand, in the configuration illustrated in FIG. 15, the first metal wire 10a is drawn out from the second row pad region PD2 to the first connection region Z in such a manner that the first metal wire 10a is narrowed to a same line width as the line width in the second connection region Y, through a part 10a1 that has the same width as the second row pad 30b. That is to say, the first metal wire 10a has, also in the first connection region Z, a part that has a same line width as the second row pad 30b.

Moreover, a similar configuration is employable in a connection section from the second connection region Y to the second row pad region PD2. In other words, as illustrated in FIG. 15, a boundary region between the second connection region Y and the second row pad region PD2 has a part 10a2 where the line width of the first metal wire 10a is broadened to the same width as the width of the second row pad 30b, in accordance with the shape of the second row pad 30b.

According to the foregoing configuration, it is possible to more securely prevent the bad leakage of case 2 explained above.

Moreover, in the foregoing embodiment, the pads disposed in a plurality of rows are described based on a configuration having two rows for simplification of the description. However, the number of rows of pads provided in the wiring board of the present invention is not limited to two rows. The number of rows may be of a larger number, such as three or four rows.

Moreover, in the foregoing description, the configuration of the pads 30 in the first row is described with reference to (a) and (b) of FIG. 10 that the first row pads 30a are formed by expanding the width of the first metal wire 10a or further providing a pad electrode 32. However, the configuration of the pads 30 in the first row of the present invention is not limited to this configuration.

Figure 16:
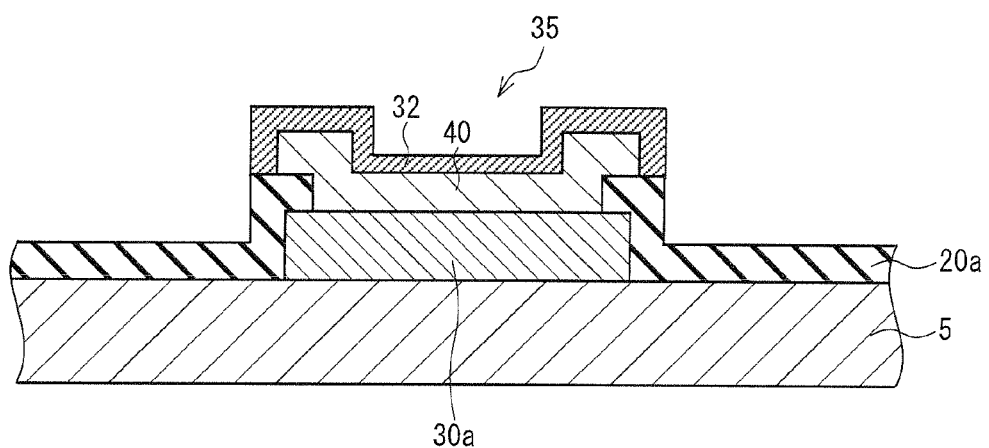
FIG. 16 is a view schematically illustrating a cross section of another embodiment of the present invention, which cross section corresponds to that taken along line F-F of FIG. 1.

For example, as illustrated in FIG. 16, it is further possible to provide, in an upper layer of the first row pad 30a formed by expanding the width of the first metal wire 10a, a connection metal section 40 made of material and the like similar to the second metal wire 10b. Moreover, if necessary, it is further possible to provide the aforementioned pad electrode 32 in an upper layer of the connection metal section 40.

According to the configuration, it is possible to reduce the difference in height between the pads 30 in the first row and the pads 30 in the second row. Hence, it is possible to attain a more reliable mounting.

Figure 17:
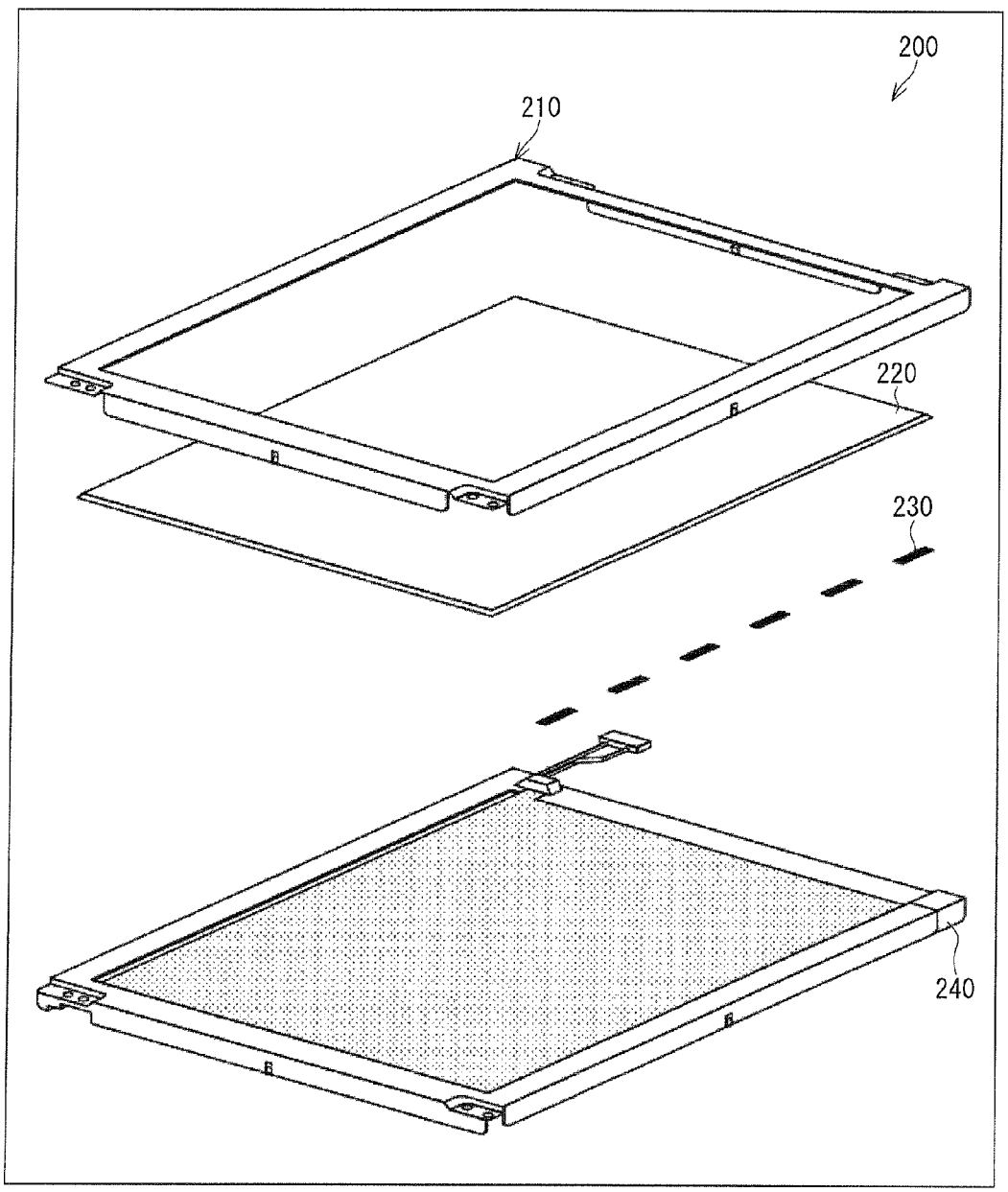
FIG. 17 illustrates an embodiment of the present invention, and is a view schematically illustrating a configuration of a liquid crystal display device.

Moreover, the wiring board of the present invention is usable in various electronic apparatuses, and is also suitably used, for example, in a liquid crystal display device. FIG. 17 schematically illustrates a configuration of a liquid crystal display device 200 in which the wiring board of the present invention is used.

As illustrated in FIG. 17, the liquid crystal display device 200 includes a frame 210, a liquid crystal panel 220, an electronic component 230 provided in the liquid crystal panel 220, and a backlight unit 240, and for example, a glass substrate for use in a liquid crystal display device that constructs the liquid crystal panel 220 can be configured by having the configuration of the wiring board of the present invention.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

INDUSTRIAL APPLICABILITY

A wiring board of the present invention allows attainment of a narrow pad pitch, and therefore is suitably applicable for use which require high density mounting.

| Reference Signs List | |
|---|---|
| 1 | wiring board |
| 5 | substrate |
| 10 | metal wire (connection wire) |
| 10a | first metal wire (connection wire of first row pad) |
| 10b | second metal wire (connection wire of second row pad) |
| 20a | first insulating layer (insulating layer) |
| 20b | second insulating layer (insulating layer) |
| 25 | insulating layer |
| 30 | pad |
| 30a | first row pad |
| 30b | second row pad |

The invention claimed is:

1. A wiring board comprising:
a substrate;
pads; and
connection wires connected to the pads, respectively, the pads being disposed in a plurality of rows, the pads disposed in the plurality of rows including:
first row pads each being connected to a respective one of the connection wires that is long in length; and
second row pads each being connected to a respective one of the connection wires that is shorter in length than that of the connection wires connected to the first row pad, each of the connection wires connected to the first row pads being provided not in a region between respective adjacent ones of the second row pads but in a lower layer region of the second row pads, in such a manner that at least an insulating layer is sandwiched between the second row pads and the connection wires connected to the first row pads, and $0.8 \leq W1/W2 \leq 1$, where $W1$ is a line width of the connection wires connected to the first row pads in the lower layer region of the second row pads, and $W2$ is a width of the second row pads.

2. The wiring board according to claim 1, wherein:

$$0 \text{ um} \leq D \leq 1 \text{ um},$$

where $D$ is a distance from an edge, in the line width direction, of the connection wires connected to the first row pads in the lower layer region of the second row pads, to an edge of a respective one of the second row pads corresponding to the edge of the connection wires connected to the first row pads, when seen as a plan view.

3. The wiring board according to claim 1, wherein:
the line width $W1$ of the connection wires and the width $W2$ of the second row pads are of a same width.

4. The wiring board according to claim 1, wherein:
both edges, in the line width direction, of the connection wires in the lower layer region of the second row pads are in line with both edges, in the width direction, of the respective one of the second row pads, when seen as a plan view.

5. The wiring board according to claim 1, wherein:
each of the second row pads is formed by broadening the line width of the connection wire connected to the second row pad.

6. The wiring board according to claim 1, wherein:
the second row pads are softer than the connection wires connected to the first row pads.

7. The wiring board according to claim 6, wherein:
the second row pads are made of aluminum, and
the connection wires connected to the first row pads are made of any one of titanium, titanium nitride, an alloy of titanium and titanium nitride, tantalum, tantalum nitride, and an alloy of tantalum and tantalum nitride.

8. The wiring board according to claim 6, wherein:
the second row pads are made of aluminum or titanium, and
the connection wires connected to the first row pads are made of nickel.

9. The wiring board according to claim 1, wherein:
the substrate is a substrate for use in a display device.

10. The wiring board according to claim 9, wherein:
the substrate for use in a display device is a glass substrate for use in a liquid crystal display device.

11. The wiring board according to claim 1, wherein:
the substrate is a substrate for use in printed wiring.

12. A liquid crystal display device comprising:
a wiring board including a substrate, pads, and connection wires connected to the pads, respectively, the pads being disposed in a plurality of rows; and
an electronic component mounted on the pads of the wiring board,
the wiring board being a glass substrate for use in a liquid crystal display device,
the pads disposed in the plurality of rows including:
first row pads each being connected to a respective one of the connection wires that is long in length; and
second row pads each being connected to a respective one of the connection wires that is shorter in length than that of the connection wires connected to the first row pads,
each of the connection wires connected to the first row pads being provided not in a region between respective adjacent ones of the second row pads but in a lower layer region of the second row pads, in such a manner that at least an insulating layer is sandwiched between the second row pads and the connection wires connected to the first row pads, and $0.8 \leq W1/W2 \leq 1$,
where W1 is a line width of the connection wires connected to the first row pads in the lower layer region of the second row pads, and W2 is a width of the second row pads.

13. A wiring board comprising:
a substrate;
pads; and
connection wires connected to the pads, respectively, the pads being disposed in a plurality of rows, the pads disposed in the plurality of rows including first row pads and second row pads, each of the first row pads being provided with a respective one of the connection wires connected to the first row pad, the connection wire connected to the first row pad passing through not a region between adjacent ones of the second row pads but a lower layer region of the second row pads, the second row pads and the connection wires connected to the first row pads sandwiching at least an insulating layer therebetween, and $0.8 \leq W1/W2 \leq 1$,
where W1 is a line width of the connection wires connected to the first row pads in the lower layer region of the second row pads, and W2 is a width of the second row pads.

14. A liquid crystal display device comprising:
a wiring board including a substrate, pads, and connection wires connected to the pads, respectively, the pads being disposed in a plurality of rows; and
an electronic component mounted on the pads of the wiring board, the wiring board being a glass substrate for use in a liquid crystal display device, the pads disposed in the plurality of rows including first row pads and second row pads, each of the first row pads being provided with a respective one of the connection wires connected to the first row pad, the connection wire connected to the first row pad passing through not a region between adjacent ones of the second row pads but a lower layer region of the second row pads, the second row pads and the connection wires connected to the first row pads sandwiching at least an insulating layer therebetween, and $0.8 \leq W1/W2 \leq 1$, where W1 is a line width of the connection wires connected to the first row pads in the lower layer region of the second row pads, and W2 is a width of the second row pads.

* * * * *